US010734551B2

(12) United States Patent
Huang et al.

(10) Patent No.: US 10,734,551 B2
(45) Date of Patent: Aug. 4, 2020

(54) LIGHT EMITTING DIODE

(71) Applicant: Genesis Photonics Inc., Tainan (TW)

(72) Inventors: Yi-Ru Huang, Tainan (TW); Tung-Lin Chuang, Tainan (TW); Yan-Ting Lan, Tainan (TW); Sheng-Tsung Hsu, Tainan (TW); Chih-Ming Shen, Tainan (TW); Jing-En Huang, Tainan (TW); Teng-Hsien Lai, Tainan (TW); Hung-Chuan Mai, Kaohsiung (TW); Kuan-Chieh Huang, New Taipei (TW); Shao-Ying Ting, Tainan (TW); Cheng-Pin Chen, Tainan (TW); Wei-Chen Chien, Tainan (TW); Chih-Chin Cheng, Tainan (TW); Chih-Hung Tseng, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 16/659,548

(22) Filed: Oct. 21, 2019

(65) Prior Publication Data

US 2020/0052159 A1   Feb. 13, 2020

Related U.S. Application Data

(63) Continuation of application No. 15/981,855, filed on May 16, 2018, now Pat. No. 10,453,999, which is a
(Continued)

(51) Int. Cl.
*H01L 33/38* (2010.01)
*H01L 33/46* (2010.01)
(Continued)

(52) U.S. Cl.
CPC .............. *H01L 33/38* (2013.01); *H01L 33/36* (2013.01); *H01L 33/382* (2013.01); *H01L 33/46* (2013.01);
(Continued)

(58) Field of Classification Search
None
See application file for complete search history.

(56) References Cited

U.S. PATENT DOCUMENTS 9,748,446 B2 * 8/2017 Jeon ..................... H01L 33/38
2009/0283787 A1   11/2009 Donofrio
(Continued)

FOREIGN PATENT DOCUMENTS

| CN | 102074622 | 5/2011 |
| CN | 105895775 | 8/2016 |

(Continued)

OTHER PUBLICATIONS

"Office Action of Taiwan Counterpart Application," dated Oct. 7, 2019, p. 1-p. 3.
(Continued)

*Primary Examiner* — Minh Loan Tran
(74) *Attorney, Agent, or Firm* — JCIPRNET

(57) ABSTRACT

The invention provides an LED including a first-type semiconductor layer, an emitting layer, a second-type semiconductor layer, a first electrode, a second electrode, a Bragg reflector structure, a conductive layer and insulation patterns. The first electrode and the second electrode are located on the same side of the Bragg reflector structure. The conductive layer is disposed between the Bragg reflector structure and the second-type semiconductor layer. The insulation patterns are disposed between the conductive layer and the second-type semiconductor layer. Each insulating layer has a first surface facing toward the second-type semiconductor layer, a second surface facing away from the second-type semiconductor layer, and an inclined surface. The inclined surface connects the first surface and the second surface and is inclined with respect to the first surface and the second surface.

19 Claims, 20 Drawing Sheets

Related U.S. Application Data continuation of application No. 15/135,573, filed on Apr. 22, 2016, now abandoned, which is a continuation-in-part of application No. 15/045,279, filed on Feb. 17, 2016, now Pat. No. 10,038,121.

(60) Provisional application No. 62/116,923, filed on Feb. 17, 2015, provisional application No. 62/151,377, filed on Apr. 22, 2015, provisional application No. 62/168,921, filed on Jun. 1, 2015.

(51) Int. Cl.
    *H01L 33/36*     (2010.01)
    *H01L 33/60*     (2010.01)
    *H01L 33/40*     (2010.01)

(52) U.S. Cl.
    CPC ............ *H01L 33/465* (2013.01); *H01L 33/60* (2013.01); *H01L 33/385* (2013.01); *H01L 33/387* (2013.01); *H01L 33/405* (2013.01)

(56) References Cited

U.S. PATENT DOCUMENTS

| | | |
|---|---|---|
| 2011/0084294 A1 | 4/2011 | Yao |
| 2011/0297972 A1 | 12/2011 | Seo |
| 2013/0277641 A1 | 10/2013 | Li |
| 2013/0292719 A1 | 11/2013 | Lee |
| 2014/0252390 A1 | 9/2014 | Yoon et al. |
| 2014/0361327 A1 | 12/2014 | Chae et al. |
| 2015/0069444 A1 | 3/2015 | Chae et al. |
| 2015/0076547 A1 | 3/2015 | Totani et al. |
| 2015/0108525 A1* | 4/2015 | Chae ...................... H01L 33/44 257/98 |
| 2016/0064617 A1* | 3/2016 | Yang ...................... H01L 33/46 257/98 |

FOREIGN PATENT DOCUMENTS

| | | |
|---|---|---|
| TW | 201013973 | 4/2010 |
| TW | 201216532 | 4/2012 |
| TW | 201415534 | 4/2014 |
| WO | 2015053595 | 4/2015 |

OTHER PUBLICATIONS

"Office Action of U.S. Appl. No. 15/727,545", dated Jan. 16, 2020, pp. 1-33.

"Office Action of China Related Application No. 201710930691.9", dated Mar. 3, 2020, pp. 1-9.

* cited by examiner

LIGHT EMITTING DIODE

CROSS-REFERENCE TO RELATED APPLICATION

This application is a continuation application of and claims the priority benefit of U.S. application Ser. No. 15/981,855, filed on May 16, 2018, now allowed. The prior U.S. application Ser. No. 15/981,855 is a continuation application of and claims the priority benefit of U.S. application Ser. No. 15/135,573, filed on Apr. 22, 2016, now abandoned. The prior U.S. application Ser. No. 15/135,573 is a continuation-in-part application of and claims the priority benefit of U.S. application Ser. No. 15/045,279, filed on Feb. 17, 2016, now patented. The prior U.S. application Ser. No. 15/045,279 claims the priority benefits of U.S. provisional application Ser. No. 62/116,923, filed on Feb. 17, 2015, U.S. provisional application Ser. No. 62/151,377, filed on Apr. 22, 2015, and U.S. provisional application Ser. No. 62/168,921, filed on Jun. 1, 2015. The entirety of each of the above-mentioned patent applications is hereby incorporated by reference herein and made a part of this specification.

BACKGROUND OF THE INVENTION

1. Field of the Invention

The invention generally relates to a light emitting diode, and more particularly, to a light emitting diode having a Bragg reflector structure.

2. Description of Related Art

Recently, the light emission efficiency of the light emitting diode (LED) is sustainably improved. In other aspect, compared with the conventional light bulbs, the LED possesses the following advantages and characteristics such as compact volume, long lifetime, low voltage/current drive, not easy to be broken, mercury-free (no pollution problems), and better light emission efficiency (power saving), etc. Due to the foregoing advantages, the light emission efficiency of the LEDs have been developed rapidly in recent years such that the conventional light bulbs are gradually replaced by the LEDs, therefore the LEDs receive great attention in the lighting and displaying technologies.

Enhancement of the light emission efficiency of the LED is the key factor for the LED to be applied in different fields. Generally, one side of the LED has a distributed Bragg reflector (DBR) structure formed thereon, so as to reflect parts of light emitted from the emitting layer of the LED toward a predetermined emitting direction and enhance the light extraction efficiency.

SUMMARY OF THE INVENTION

The invention provides a light emitting diode (LED) having preferable properties.

An embodiment of the invention provides an LED, which includes a first-type semiconductor layer, an emitting layer, a second-type semiconductor layer, a first electrode, a second electrode, a Bragg reflector structure, a conductive layer and a plurality of insulation patterns. The emitting layer is located between the first-type semiconductor layer and the second-type semiconductor layer. The first electrode is electrically connected to the first-type semiconductor layer. The second electrode is electrically connected to the second-type semiconductor layer. The first electrode and the second electrode are located on the same side of the Bragg reflector structure. The conductive layer is disposed between the Bragg reflector structure and the second-type semiconductor layer. The insulation patterns are disposed between the conductive layer and the second-type semiconductor layer, and an area of the conductive layer outside the insulation patterns contacts the second-type semiconductor layer. Each insulating layer has a first surface facing toward the second-type semiconductor layer, a second surface facing away from the second-type semiconductor layer, and an inclined surface. The inclined surface connects the first surface and the second surface and is inclined with respect to the first surface and the second surface.

In an embodiment of the invention, an acute angle θ1 is formed between the inclined surface and the first surface in a material of each of the insulation patterns.

In an embodiment of the invention, $10° \leq \theta1 \leq 80°$.

In an embodiment of the invention, $30° \leq \theta1 \leq 50°$.

In an embodiment of the invention, each of the insulation patterns includes a plurality of first sub-layers and a plurality of second sub-layers. The first sub-layers and the second sub-layers are stacked alternately.

In an embodiment of the invention, a material of the first sub-layers is different from a material of the second sub-layers.

In an embodiment of the invention, a material of the first sub-layers is the same as a material of the second sub-layers, and a density of the first sub-layers is different from a density of the second sub-layers.

In an embodiment of the invention, the material of each of the first sub-layers includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof.

In an embodiment of the invention, a material of each of the second sub-layers includes silicon dioxide ($SiO_2$).

In an embodiment of the invention, a material of each of the first sub-layers is the same as a material of each of the second sub-layers, and a density of each of the first sub-layers is different from a density of each of the second sub-layers.

In an embodiment of the invention, a reflectance of the Bragg reflector structure is greater than or equal to 95% in a reflective wavelength range at least covering 0.8X nm to 1.8X nm. The emitting layer is adapted to emit a beam, the beam has a peak wavelength within an emission wavelength range, and X is the peak wavelength of the emission wavelength range.

In an embodiment of the invention, the first-type semiconductor layer includes a first portion and a second portion. The emitting layer is stacked on the first portion, and the second portion extends out of an area of the emitting layer from the first portion, so as to electrically connect with the first electrode. The first electrode, the emitting layer, the second-type semiconductor layer, and the second electrode are located on a first side of the first-type semiconductor layer.

In an embodiment of the invention, the Bragg reflector structure is located on a first side of the first-type semiconductor layer. The Bragg reflector structure is at least located between the second electrode and the second-type semiconductor layer. The Bragg reflector structure comprises a plurality of through holes. The second electrode is filled into the through holes to electrically connect with the second-type semiconductor layer.

In an embodiment of the invention, the insulation patterns correspond to the through holes.

An embodiment of the invention provides an LED, which includes a first-type semiconductor layer, an emitting layer, a second-type semiconductor layer, a first electrode, a second electrode, a Bragg reflector structure, a conductive layer and a plurality of insulation patterns. The emitting layer is located between the first-type semiconductor layer and the second-type semiconductor layer. The first electrode is electrically connected to the first-type semiconductor layer. The second electrode is electrically connected to the second-type semiconductor layer. The first electrode and the second electrode are located on the same side of the Bragg reflector structure. The conductive layer is disposed between the Bragg reflector structure and the second-type semiconductor layer. The insulation patterns are disposed between the conductive layer and the second-type semiconductor layer, and an area of the conductive layer outside the insulation patterns contacts the second-type semiconductor layer. Each of the insulation patterns includes a plurality of first sub-layers and a plurality of second sub-layers, and the first sub-layers and the second sub-layers are alternately stacked.

In an embodiment of the invention, the LED further includes a growth substrate. The first-type semiconductor layer, the emitting layer, the second-type semiconductor layer, and the Bragg reflector structure are sequentially stacked on a first surface of the growth substrate.

In an embodiment of the invention, the LED further includes a first insulating layer and a second insulating layer. The Bragg reflector structure is disposed between the first insulating layer and the second insulating layer. The first insulating layer is located between the Bragg reflector structure and the second-type semiconductor layer. The second insulating layer is located between the Bragg reflector structure and the second electrode.

In an embodiment of the invention, a material of the first sub-layers is different from a material of the second sub-layers.

In an embodiment of the invention, a material of the first sub-layers is the same as a material of the second sub-layers, and a density of the first sub-layers is different from a density of the second sub-layers.

In an embodiment of the invention, the material of each of the first sub-layers includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof.

In an embodiment of the invention, a material of each of the second sub-layers includes silicon dioxide ($SiO_2$).

In an embodiment of the invention, a material of each of the first sub-layers is the same as a material of each of the second sub-layers, and a density of each of the first sub-layers is different from a density of each of the second sub-layers.

In an embodiment of the invention, a reflectance of the Bragg reflector structure is greater than or equal to 95% in a reflective wavelength range at least covering 0.8X nm to 1.8X nm. The emitting layer is adapted to emit a beam, the beam has a peak wavelength within an emission wavelength range, and X is the peak wavelength of the emission wavelength range.

In an embodiment of the invention, the first-type semiconductor layer includes a first portion and a second portion. The emitting layer is stacked on the first portion, and the second portion extends out of an area of the emitting layer from the first portion, so as to electrically connect with the first electrode. The first electrode, the emitting layer, the second-type semiconductor layer, and the second electrode are located on a first side of the first-type semiconductor layer.

In an embodiment of the invention, the Bragg reflector structure is located on a first side of the first-type semiconductor layer. The Bragg reflector structure is at least located between the second electrode and the second-type semiconductor layer. The Bragg reflector structure comprises a plurality of through holes. The second electrode is filled into the through holes to electrically connect with the second-type semiconductor layer.

In an embodiment of the invention, the insulation patterns correspond to the through holes.

Based on the above, the sidewall of the Bragg reflector structure in the light emitting diode according to an embodiment of the invention is an inclined surface. Therefore, a layer disposed on the Bragg reflector structure may properly cover the Bragg reflector structure, so as to facilitate the performance of the light emitting diode.

To make the aforesaid features and advantages of the invention more comprehensible, several embodiments accompanied with drawings are described in details as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
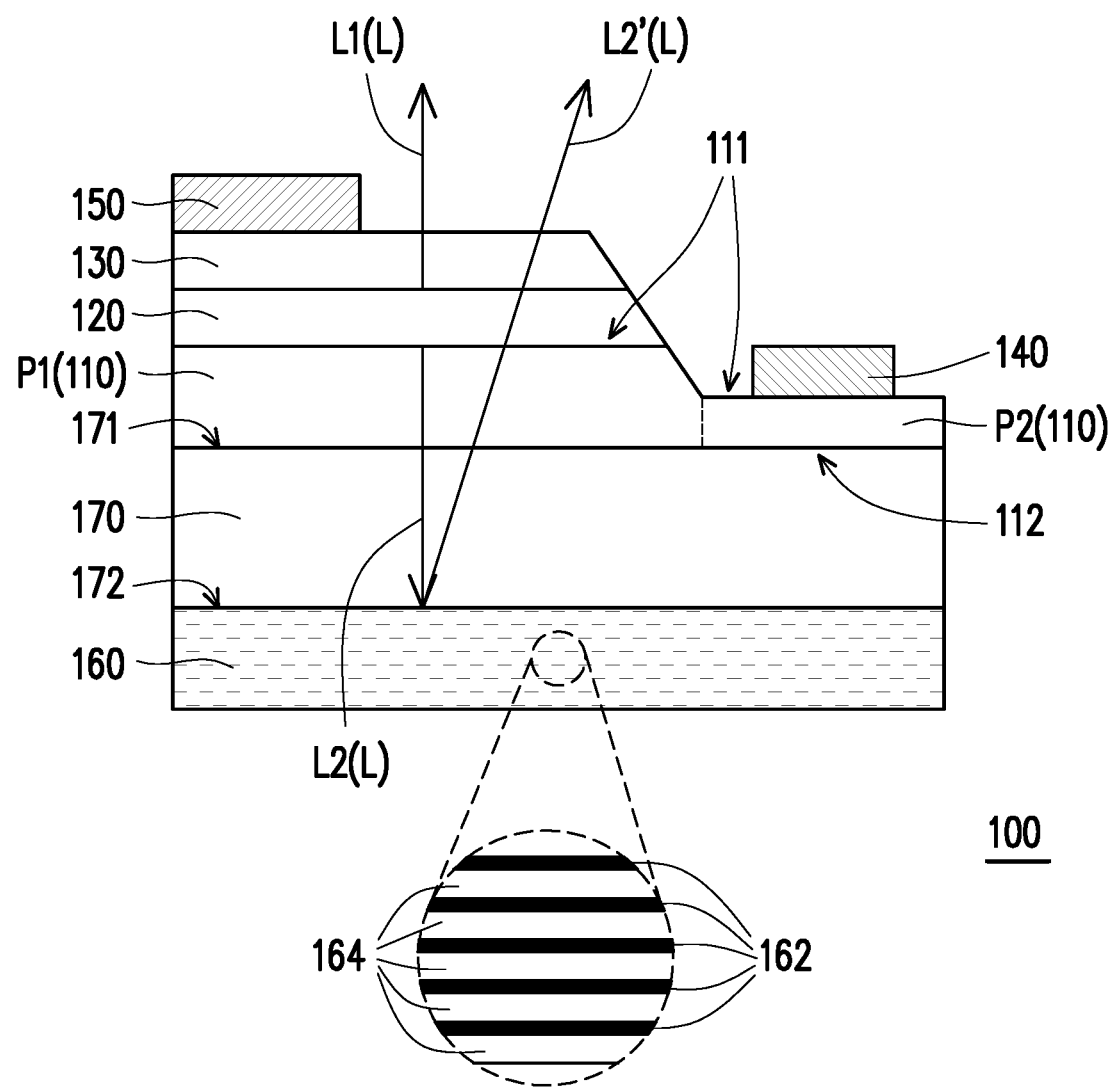
FIG. 1A is a schematic cross-sectional view of an LED according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a schematic cross-sectional view of an LED according to an embodiment of the invention. Referring to FIG. 1A, specifically, FIG. 1A illustrates a horizontal type LED, which is an LED applicable to wire bonding. The LED 100 includes a first-type semiconductor layer 110, an emitting layer 120, a second-type semiconductor layer 130, a first electrode 140, a second electrode 150, and a Bragg reflector structure 160. In the present embodiment, one of the first-type semiconductor layer 110 and the second-type semiconductor layer 130 is an N-type semiconductor layer (e.g., n-GaN), and another one is a P-type semiconductor layer (e.g., p-GaN). The emitting layer 120 is located between the first-type semiconductor layer 110 and the second-type semiconductor layer 130, the emitting layer 120 is configured to emit a light beam L, and a light emitting wavelength range of the light beam L has a peak wavelength. The first electrode 140 is electrically connected to the first-type semiconductor layer 110. The second electrode 150 is electrically connected to the second-type semiconductor layer 130. The first-type semiconductor layer 110, the emitting layer 120, and the second-type semiconductor layer 130 are located on the same side of the Bragg reflector structure 160. A reflectance of the Bragg reflector structure 160 is greater than or equal to 90% in a reflective wavelength range at least covering 0.8X nm to 1.8X nm, the reflectance is greater than or equal to 95% in a reflective wavelength range at least covering 0.9X nm to 1.6X nm, in which X is the peak wavelength of the light emitting wavelength range.

In an embodiment, the emitting layer 120 may be a quantum well (QW) structure. In other embodiments, the emitting layer 120 may be a multiple quantum well (MQW) structure, in which the MQW structure includes a plurality of well layer and a plurality of barrier layer alternately disposed in a repeating manner. In addition, a material of the emitting layer 120 includes the compositions of compound semiconductors capable to emitting the light beam L having the peak wavelength in the range of 320 nm to 430 nm (ultraviolet light), 430 nm to 500 nm (blue light), or 500 nm to 550 nm (green light). The variation in the compositions or structural configurations of the emitting layer 120 may alter the light emitting wavelength range of the light beam L, but the invention is not limited thereto.

In detail, in the present embodiment, the first-type semiconductor 110 includes a first portion P1 and a second portion P2. The emitting layer 120 is stacked on the first portion P1. The second portion P2 extends out of an area of the emitting layer 120 from the first portion P1, so as to electrically connect with the first electrode 140. The first-type semiconductor layer 110 includes a first side 111 and a second side 112 opposite to the first side 111. The emitting layer 120, the second-type semiconductor layer 130, the first electrode 140, and the second electrode 150 are located on the first side 111 of the first-type semiconductor layer 110. The Bragg reflector structure 160 is located on the second side 112 of the first-type semiconductor layer 110.

In particular, the LED 110 of the present embodiment further includes a growth substrate 170. The growth substrate 170 includes a first surface 171 and a second surface 172 opposite to the first surface 171. A material of the substrate 170 is, for example, C-Plane, R-Plane, or A-plane Sapphire substrate or other transparent materials. Additionally, single crystalline compounds having a lattice constant close to the first-type semiconductor layer 110 are also suitable to be used as a material for the growth substrate 170. The first-type semiconductor layer 110, the emitting layer 120, and the second-type semiconductor layer 130 of the present embodiment are sequentially grown and stacked on the first surface 171 of the growth substrate 170. The Bragg reflector structure 160 is disposed on the second surface 172 of the growth substrate 170. In other embodiments, the LED 110 may not have the growth substrate 170, and the Bragg reflector structure 160 is disposed on the second side 112 of the first-type semiconductor layer 110.

Generally, the light beam L emitted from the emitting layer 120 emits toward all directions, for example, the light beam L1 and the light beam L2 emit toward different directions from the emitting layer 120. However, when the emitting direction of the light beam L1 is configured as the main emitting direction of the LED 110, the light beam L2 may not be utilized, causing the limitation to the light emission efficiency. Therefore, in the present embodiment, the Bragg reflector structure 160 is used for reflecting the light beam L2 traveling downward and guiding the light beam L2 toward the upper side of the growth substrate 170, that is the reflecting light beam L2'. In this way, the light beam emitted from the emitting layer 120 can be effectively emitted toward a predetermined emitting direction, with an excellent light emission efficiency.

In particular, the Bragg reflector structure 160 is mainly formed by a combination of at least one primary stacked layer region, at least one buffer stacked layer region, and at least one repair stacked layer region. The primary stacked layer region, the buffer stacked layer region, and the repair stacked layer region respectively includes a plurality of first refractive layers 162 and a plurality of second refractive layers 164, and the first refractive layers 162 and the second refractive layers 164 are stacked alternately. A refractive index of each of the first refractive layers 162 is different from a refractive index of each of the second refractive layers 164. The buffer stacked layer region may be located between two adjacent primary stacked layer regions, so as to increase the reflectance of the two adjacent primary stacked layer regions. The repair stacked layer region is at least located on one side of the primary stacked layer region, so as to increase the reflectance of the primary stacked layer region. In addition, a structure for increasing the reflectance of the Bragg reflector structure is added, in which the buffer stacked layer region may be located between two adjacent repair stacked layer regions and the primary stacked layer region may be located between two repair stacked layer regions, so as to increase the reflectance of the two adjacent primary stacked layer regions. In other words, the Bragg reflector structure 160 is formed by periodic structure, partial periodic structure, gradually increasing structure, or gradually decreasing structure of alternately stacked first refractive layers 162 and second refractive layers 164. That is, in the Bragg reflector structure 160, one of the at least one pair of the adjacent two layers is the first refractive layer 162 and another one is the second refractive layer 164. In an embodiment, materials and thicknesses of the first refractive layers 162 and the second refractive layers 164 are respectively related to the reflective wavelength range of the Bragg reflector structure 160. The structures of the primary stacked layer region, the buffer stacked layer region, or the repair stacked layer region are formed by arranging the first refractive layers 162 and the second refractive layers 164 alternately, and may be formed by the same periodic structure, a different periodic structure, a gradually increasing structure, or a gradually decreasing structure. A number of the layers of the periodic structure, the partial periodic structure, the gradually increasing structure, or the gradually decreasing structure of the primary stacked layer region is larger than the number of the layers of the periodic structure, the partial periodic structure, the gradually increasing structure, or the gradually decreasing structure of the buffer stacked layer region or the repair stacked layer region. The buffer stacked layer region at least includes a material contained in the two adjacent stacked layer regions, and the material thereof may be the same material or a material with the same refractive index. Additionally, thicknesses of the first refractive layers 162 and the second refractive layers 164 may be the same or different.

A material of the first refractive layers 162 in the present embodiment includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof. On the other hand, a material of the second refractive layers 164 includes silicon oxide ($SiO_2$). By selecting the materials of the first refractive layer 162 and the second refractive layer 164, the probability of the light beam L2 being absorbed by the first refractive layer 162 and the second refractive layer 164 can be reduced, thereby increasing the possibility of the light beam L2 being reflected, and thus the light emission efficiency and brightness of the LED 100 can be increased. Especially, in the present embodiment, the Bragg reflector structure 160 has excellent reflectance (greater than or equal to 95%) with respect to different reflectance wavelength ranges, thereby allowing the LED 100 to be suitable in applications of light emitting device which requires to emit different light emitting wavelength ranges. Specifically, if the adjacent first refractive layer 162 and second refractive layer 164 are being regarded as a stacked layer pair, the Bragg reflector structure 160 applied to the LED 100 may include more than or equal to 4 to less than or equal to 100 or even more stacked layer pairs. In addition, the number of the stack layer pair can be adjusted according to the desired reflective properties, and it construes no limitation in the invention. For example, 30 to 50 stacked layer pairs may be adopted to constitute the Bragg reflector structure 160.

If the light beam L provided by the LED 100 is ultraviolet light, the peak wavelength of the light emitting wavelength range falls in a range of 320 nm to 430 nm. Meanwhile, the material of the first refractive layers 162 in the Bragg reflector structure 160 may be selected from materials containing tantalum (Ta) such as tantalum pentoxide ($Ta_2O_5$), and the material of the second refractive layers 164 may be selected from silicon oxide ($SiO_2$), but they construe no limitation in the invention. For example, when the peak wavelength of the light emitting wavelength range is 400 nm, through adjusting the material, thickness, and the number of stacked layer pair in the present embodiment, the Bragg reflector structure 160 is capable to providing a reflectance greater than or equal to 90% in the reflective wavelength range at least covering 320 nm (0.8 times the peak wavelength) to 720 nm (1.8 times the peak wavelength). Additionally, in other preferable embodiments, when the peak wavelength of the light emitting wavelength range is 400 nm, the Bragg reflector structure 160 is capable to providing a reflectance greater than or equal to 95% in the reflective wavelength range at least covering 360 nm (0.9 times the peak wavelength) to 560 nm (1.4 times the peak wavelength).

Figure 1B:
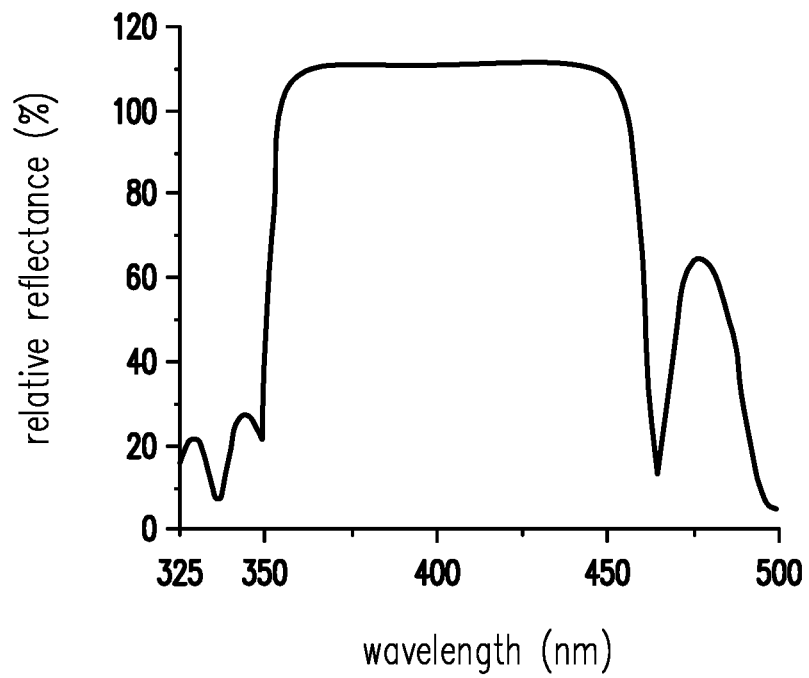
FIG. 1B is a reflection spectrum of a Bragg reflector structure according to an embodiment of the invention.

FIG. 1B is a reflection spectrum of a Bragg reflector structure according to an embodiment of the invention. In FIG. 1B, the horizontal axis denotes wavelength and the vertical axis denotes relative reflectance, and the relative reflectance is the reflectance of the Bragg reflector structure relative to a reflectance of an aluminium metal layer. In an embodiment, the Bragg reflector structure having the reflection spectrum illustrated in FIG. 1B utilizes tantalum pentoxide ($Ta_2O_5$) as the first refractive layers and silicon dioxide ($SiO_2$) as the second refractive layer. Additionally, the first refractive layers and the second refractive layers in the Bragg reflector structure respectively includes 30 layers, and the first refractive layers and the second refractive layers are stacked alternately in a repeating manner to form the Bragg reflector structure. As illustrated in FIG. 1B, as compared with the aluminium metal layer, the Bragg reflector structure has a relative reflectance higher than 100% in the wavelength range of 350 nm to 450 nm. As a result, a light emitting chip having the Bragg reflector structure can be used for ultraviolet light emitting device, thereby enhancing the light extraction efficiency of the ultraviolet light emitting device.

Referring to FIG. 1A, if the light beam L provided by the LED 100 is blue light, the peak wavelength of the light emitting wavelength range falls in a range of 420 nm to 500 nm. Meanwhile, the material of the first refractive layers 162 in the Bragg reflector structure 160 may be selected from materials containing titanium (Ti) such as titanium dioxide ($TiO_2$), and the material of the second refractive layers 164 may be selected from silicon oxide ($SiO_2$), but they construe no limitation in the invention. For example, when the peak wavelength of the light emitting wavelength range is 450 nm, through adjusting the material, thickness, and the number of stacked layer pair in the present embodiment, the Bragg reflector structure 160 is capable to providing a reflectance greater than or equal to 90% in the reflective wavelength range at least covering 360 nm (0.8 times the peak wavelength) to 810 nm (1.8 times the peak wavelength). Additionally, in other embodiments, when the peak wavelength of the light emitting wavelength range is 450 nm, the Bragg reflector structure 160 is capable to providing a reflectance greater than or equal to 95% in the reflective wavelength range at least covering 405 nm (0.9 times the peak wavelength) to 720 nm (1.6 times the peak wavelength).

If the light beam L provided by the LED 100 is blue light while containing a wavelength conversion structure such as phosphor powder through different packing type, the light beam L provided by the LED 100 is blue light and can be excited by the wavelength conversion structure to render another peak wavelength of an excitation wavelength. The another peak wavelength of the excitation wavelength is greater than the peak wavelength of the light beam L provided by the LED 100, so as to allow the light beam at least includes more than one peak wavelength, and the peak wavelengths of the light emitting wavelength range and the excitation wavelength range may fall in a range of 400 nm to 700 nm. Meanwhile, the material of the first refractive layers 162 in the Bragg reflector structure 160 may be selected from materials containing titanium (Ti) such as titanium dioxide ($TiO_2$), and the material of the second refractive layers 164 may be selected from silicon oxide ($SiO_2$), but they construe no limitation in the invention.

For example, when at least one of the peak wavelength of the light emitting wavelength range is 445 nm and the peak wavelength of the excitation wavelength is 580 nm, or in addition, a peak wavelength of an excitation wavelength of 620 nm may be included, through adjusting the material, thickness, and the number of stacked layer pair in the present embodiment, the Bragg reflector structure 160 is capable to providing a reflectance greater than or equal to 90% in the reflective wavelength range at least covering 356 nm (0.8 times the peak wavelength) to 801 nm (1.8 times the peak wavelength). Additionally, in other embodiments, when the peak wavelength of the light emitting wavelength range is 445 nm, the Bragg reflector structure 160 is capable to providing a reflectance greater than or equal to 95% in the reflective wavelength range at least covering 400.5 nm (0.9 times the peak wavelength) to 712 nm (1.6 times the peak wavelength).

If the light beam L provided by the LED 100 is green light, the peak wavelength of the light emitting wavelength range falls in a range of 500 nm to 550 nm. Meanwhile, the material of the first refractive layers 162 in the Bragg reflector structure 160 may be selected from materials containing titanium (Ti) such as titanium dioxide ($TiO_2$), and the material of the second refractive layers 164 may be selected from silicon oxide ($SiO_2$), but they construe no limitation in the invention. For example, when the peak wavelength of the light emitting wavelength range is 525 nm, through adjusting the material, thickness, and the number of stacked layer pair in the present embodiment, the Bragg reflector structure 160 is capable to providing a reflectance greater than or equal to 90% in the reflective wavelength range at least covering 420 nm (0.8 times the peak wavelength) to 997.5 nm (1.9 times the peak wavelength). Additionally, in other embodiments, when the peak wavelength of the light emitting wavelength range is 525 nm, the Bragg reflector structure 160 is capable to providing a reflectance greater than or equal to 95% in the reflective wavelength range at least covering 472.5 nm (0.9 times the peak wavelength) to 840 nm (1.6 times the peak wavelength).

Figure 1C:
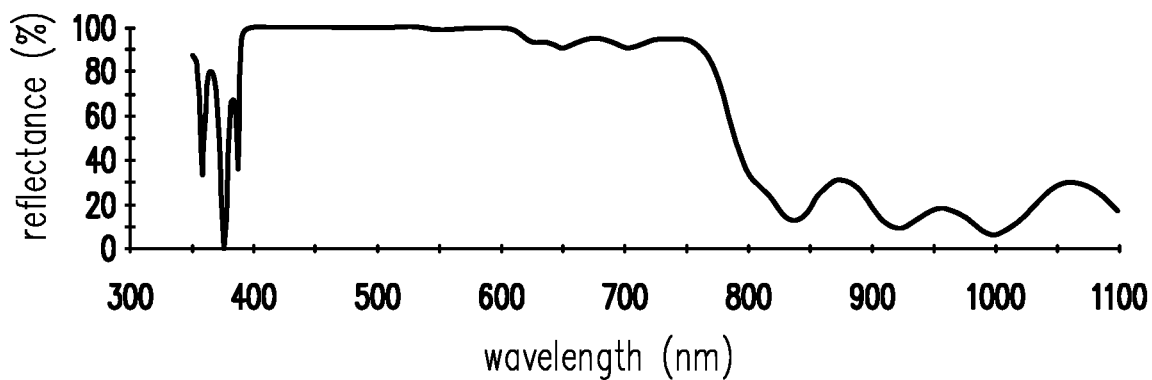
FIG. 1C is a reflection spectrum of a Bragg reflector structure according to an embodiment of the invention.

FIG. 1C is a reflection spectrum of a Bragg reflector structure according to another embodiment of the invention. In FIG. 1C, the horizontal axis denotes wavelength and the vertical axis denotes reflectance. In an embodiment, the Bragg reflector structure having the reflection spectrum illustrated in FIG. 1C utilizes titanium dioxide ($TiO_2$) as the first reflective layers and silicon dioxide ($SiO_2$) as the second reflective layers. Additionally, the first refractive layers and the second refractive layers in the Bragg reflector structure respectively includes 24 layers, and the first refractive layers and the second refractive layers are stacked alternately in a repeating manner to form the Bragg reflector structure. As illustrated in FIG. 1C, in the reflection spectrum of the Bragg reflector structure, the reflectance is approximately higher than or equal to 90% in the wavelength range of 400 nm to 700 nm, and even more, the reflectance is maintained at close to 100% in the wavelength range of 400 nm to 600 nm. Since the reflection spectrum of the Bragg reflector structure has high reflectance in a broader wavelength range, the Bragg reflector structure is capable to providing reflection effects in the broader wavelength range for a wider view angle.

The reflection spectrum of the Bragg reflector structure still has a high reflectance in a wavelength range slightly lower than 400 nm and closer to 400 nm, the reflection spectrum of the Bragg reflector structure still has a high reflectance in a wavelength range slightly higher than 700 nm, and even has a decent reflectance in a wavelength range approximately closer to 800 nm. As a result, a light emitting chip having the Bragg reflector structure can be used for visible light emitting device, thereby enhancing the light extraction efficiency of the visible light emitting device. Additionally, as illustrated in FIG. 1C, the Bragg reflector structure at a longer wavelength range, for example, 800 nm to 900 nm, or even more than 900 nm, has a reflectance lower than 40%. In this way, the process feasibility of the light emitting chip having the Bragg reflector structure in laser cutting and batch sheet can be enhanced.

In the present embodiment, when the light emitting chip having the Bragg reflector structure is applied on the light emitting device, the emitting wavelength of the emitting layer of the light emitting chip may only cover part of the visible light wavelength range. In addition, the light emitting device may further include phosphor powder, and the excitation wavelength of the phosphor powder may cover another part of the visible light wavelength range. For example, the emitting wavelength of the emitting layer may be blue light or green light, and the excitation wavelength of the phosphor powder may be yellow light, green light, or red light, etc. In this way, through the disposition of the light emitting chip and the phosphor powder, the light emitting device may emit white light, and the Bragg reflector structure in the light emitting chip may efficiently reflect the wavelength range covered by the white light. In other words, in the light emitting chip, the light emitting wavelength of the emitting layer and the reflective wavelength of the Bragg reflector structure can be only partially overlapped, and are not required to be consistent with each other. Certainly, in the light emitting chip, the light emitting wavelength of the emitting layer and the reflective wavelength of the Bragg reflector structure may also be configured corresponding to each other, for example, both fall in the wavelength range of the blue light, both fall in the wavelength range of the green light, or both fall in the wavelength range of the red light.

It should be mentioned that reference numerals and some descriptions provided in the previous exemplary embodiment are also applied in the following exemplary embodiment. The same reference numerals are presented to denote identical or similar components in these exemplary embodiments, and repetitive descriptions are omitted. The omitted descriptions may be found in the previous exemplary embodiments, and will not be repeated hereinafter.

Figure 2:
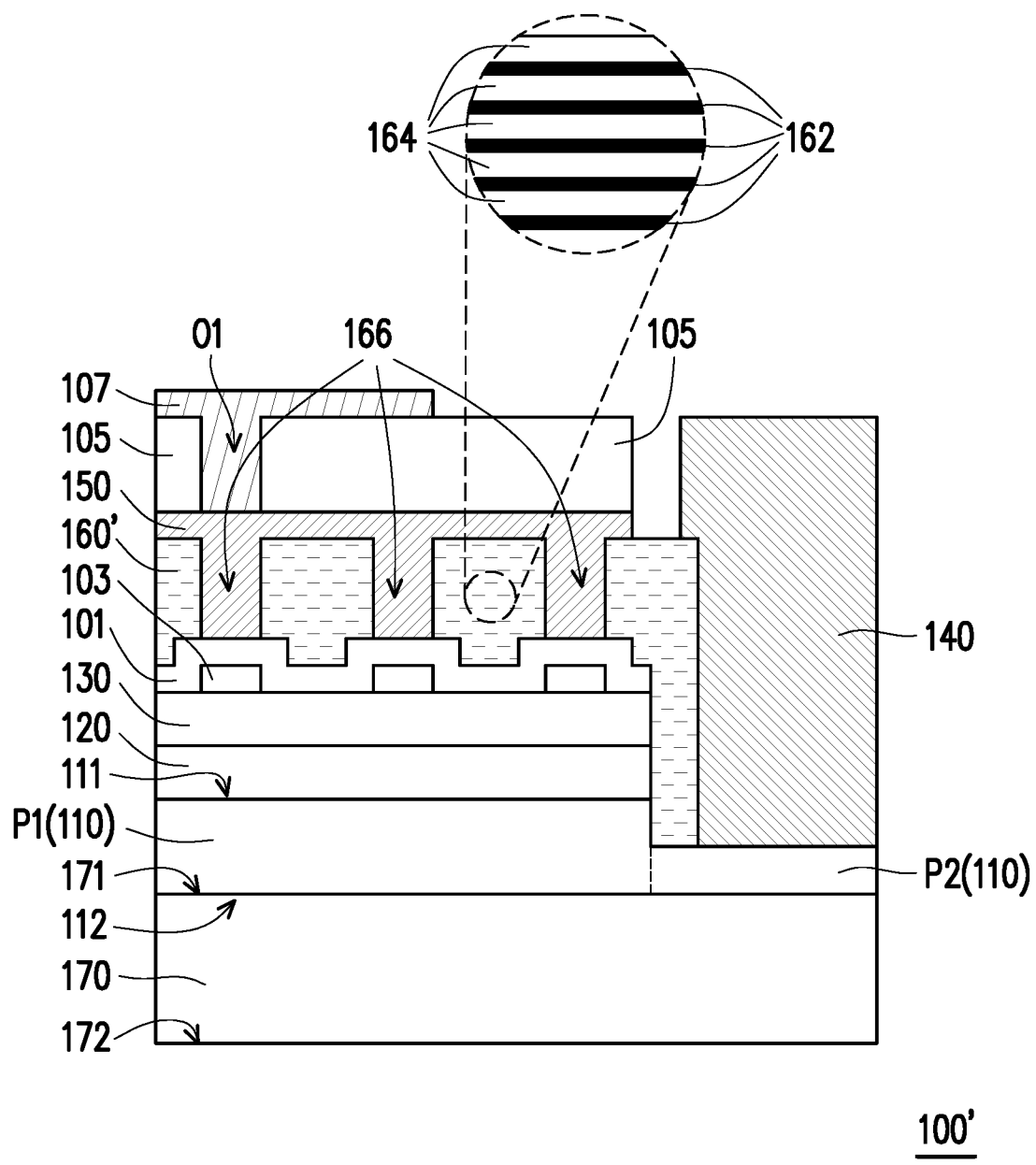
FIG. 2 is a schematic cross-sectional view of an LED according to another embodiment of the invention.

FIG. 2 is a schematic cross-sectional view of an LED according to another embodiment of the invention. FIG. 2 is a schematic cross-sectional view of an LED according to another embodiment of the invention. Referring to FIG. 2, the LED 100' illustrated in FIG. 2 is an LED applicable to flip chip packaging. The LED 100' in the present embodiment is similar to the LED 100 in FIG. 1A, and the major difference lies in that: the Bragg reflector structure 160' is located between the second electrode 150 and the second-type semiconductor layer 130, and the Bragg reflector structure 160' has a plurality of through holes 166. In other words, the first-type semiconductor layer 110, the emitting layer 120, the second-type semiconductor layer 130, and the Bragg reflector structure 160' in the present embodiment are sequentially stacked on the first surface 171 of the growth substrate 170. In addition, the second electrode 150 is filled into the through holes 166 to electrically connect with the second-type semiconductor layer 130.

In particular, in the present embodiment, the LED 100' further includes a conductive layer 101 and a plurality of insulation patterns 103, and the insulation patterns 103 may not connect to each other. The conductive layer 101 is disposed between the Bragg reflector structure 160' and the second-type semiconductor layer 130, and the second electrode 150 filled into the through holes 166 may contact the conductive layer 101 to be electrically connected to the second-type semiconductor 130 via the conductive layer 101. A material of the conductive layer 101 is, for example, indium tin oxide (ITO) or other materials having characteristics of current dispersion and allowing light to pass through.

On the other hand, the insulation patterns 103 are disposed between the conductive layer 101 and the second-type semiconductor layer 130, and part of the insulation patterns 103 are disposed corresponding to the through holes 166 such that an area of the conductive layer 101 outside of the insulation patterns 103 contacts the second-type semiconductor layer 130. To take a step further, a material of the insulation patterns 103 includes, for example, silicon dioxide ($SiO_2$) or other materials having characteristic of current blocking. The conductive layer 101 and the insulation patterns 103 are disposed to uniformly disperse the current transferred in the emitting layer 130 to avoid the current from concentrating at certain part of the emitting layer 120, thereby allowing uniform distribution of the light emitting region of the emitting layer 120. Therefore, the above configuration enables better light emitting uniformity of the LED 100'.

In the present embodiment, since the LED 100' is a flip chip packaging type LED, an insulating layer 105 and an electrode pad 107 may further be disposed on the second electrode 150. The insulating layer 105 has a through hole O1, and the electrode pad 107 is filled into the through holes O1, so that the electrode pad 107 is electrically connected to the second electrode 150. In order to electrically connect or physically connect with an external substrate during the bonding process of the flip chip, a material of the electrode pad 107 and the first electrode 140 is, for example, gold (Au), gold/tin (Au/Sn) alloy, or other conductive materials applicable in eutectic bonding. Herein, the first electrode 140 can be used for eutectic bonding directly, but it construes no limitation in the invention. In other embodiments, the first electrode 140 and the second electrode 150 may be formed by the same material, and an additional electrode pad used for eutectic bonding can be disposed above the first electrode 140.

In the present embodiment, the specific configuration and the material of the Bragg reflector structure 160' can be the same as the Bragg reflector structure 160 in the previous embodiment. Therefore, the reflectance of the Bragg reflector structure 160' has an excellent performance in the short wavelength range, thereby allowing the LED 100' also to be suitable in applications of light emitting device which requires to emit at the short wavelength range.

Figure 3:
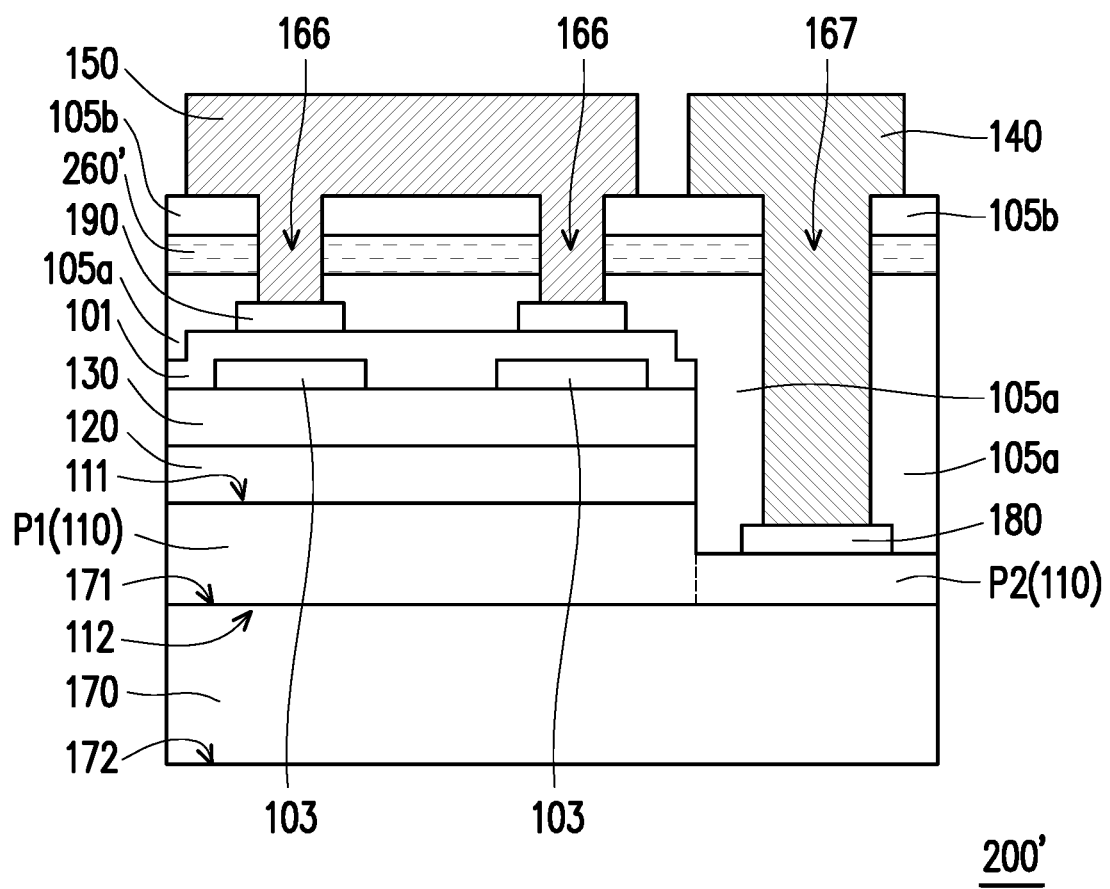
FIG. 3 is a schematic cross-sectional view of an LED according to another embodiment of the invention.

FIG. 3 is a schematic cross-sectional view of an LED according to another embodiment of the invention. Referring to FIG. 3, the LED illustrated in FIG. 3 is another LED applicable to flip chip packaging. The LED 200' in the present embodiment is similar to the LED 100' in FIG. 2, and the major difference lies in that: the Bragg reflector structure 260' is located between the second electrode 150 and the second-type semiconductor 130, and the Bragg reflector structure 160' has a plurality of through holes 166 located between the second electrode 150 and the second-type semiconductor 130 and a plurality of through holes 167 located between the first electrode 140 and the first-type semiconductor 110. In other words, the first-type semiconductor layer 110, the emitting layer 120, the second-type semiconductor layer 130, and the Bragg reflector structure 260' in the present embodiment are sequentially stacked on the first surface 171 of the growth substrate 170. In addition, the second electrode 150 is filled into the through holes 166 to electrically connect with the second-type semiconductor layer 130 and the first electrode 140 is filled into the through holes 166 to electrically connect with the first-type semiconductor layer 110. Although only one through hole 167 is illustrated in FIG. 3, in the specific implementation, number of the through hole 167 may be adjusted based on the actual configuration.

In particular, in the present embodiment, the LED 200' further includes a conductive layer 101 and a plurality of insulation patterns 103, and the insulation patterns 103 may not connect to each other. The conductive layer 101 is disposed between the Bragg reflector structure 260' and the second-type semiconductor layer 130, and the second electrode 150 filled into the through holes 166 may contact the conductive layer 101 to be electrically connected to the second-type semiconductor 130 via the conductive layer 101. A material of the conductive layer 101 is, for example, indium tin oxide (ITO) or other materials having characteristics of current dispersion and allowing light to pass through.

On the other hand, the insulation patterns 103 are disposed between the conductive layer 101 and the second-type semiconductor layer 130, and part of the insulation patterns 103 are disposed corresponding to positions of the through holes 166 such that an area of the conductive layer 101 outside of the insulation patterns 103 contacts the second-type semiconductor layer 130. To take a step further, a material of the insulation patterns 103 includes, for example, silicon dioxide ($SiO_2$) or other materials having characteristic of current blocking. The conductive layer 101 and the insulation patterns 103 are disposed to uniformly disperse the current transferred in the emitting layer 130 to avoid the current from concentrating at certain part of the emitting layer 120, thereby allowing uniform distribution of the light emitting region of the emitting layer 120. Therefore, the above configuration enables better light emitting uniformity of the LED 200'.

Additionally, in the present embodiment, the LED 200' further includes at least one first metal layer 180 located between the first electrode 140 and the first-type semiconductor layer 110 and at least one second metal layer 190 located between the second electrode 150 and the second-type semiconductor layer 130. Part of the Bragg reflector structure 260' is located on the first metal layer 180 or the second metal layer 190. In other words, the first-type semiconductor layer 110, the emitting layer 120, the second-type semiconductor layer 130, and the Bragg reflector structure 260' in the present embodiment are sequentially stacked on the first surface 171 of the growth substrate 170. In addition, the first electrode 140 is filled into the through holes 167 to electrically connect with the first type semiconductor layer 110 through the first metal layer 180, and the second electrode 150 is filled into the through holes 166 to electrically connect with the second-type semiconductor layer 130 through the second metal layer 190.

In the present embodiment, on the other hand, the LED 200' further includes a first insulating layer 105a and a second insulating layer 105b. The first insulating layer 105a is disposed on the first-type semiconductor layer 110, the second-type semiconductor layer 130, and sidewalls of the first-type semiconductor layer 110, the emitting layer 120, and the second-type semiconductor layer 130. The first insulating layer 105a may further dispose on part of the first metal layer 180, part of the second metal layer 190, and the conductive layer 101, and at least part of the Bragg reflector structure 260' is located between the first insulating layer 105a and the second insulating layer 105b. Furthermore, the second insulating layer 105b may be disposed on the Bragg reflector structure 260'. In other words, the first-type semiconductor layer 110, the emitting layer 120, the second-type semiconductor layer 130, and the Bragg reflector structure 260' in the present embodiment are sequentially stacked on the first surface 171 of the growth substrate 170. In addition, the through holes 166 penetrate through the second insulating layer 105b, the Bragg reflector structure 260', and the first insulating layer 105a, so as to allow the second electrode 150 to fill into the through holes 166 and to electrically connect with the second metal layer 190 and the second-type semiconductor layer 130. Similarly, the through holes 167 penetrate through the second insulating layer 105b, the Bragg reflector structure 260', and the first insulating layer 105a, so as to allow the first electrode 140 to fill into the through holes 167 and to electrically connect with the first metal layer 180 and the first-type semiconductor layer 110. A material of the first insulating layer 105a and the second insulating layer 105b includes, for example, silicon dioxide ($SiO_2$), or the material thereof may be the same material or a material with the same refractive index. Moreover, the material of the first insulating layer 105a and the second insulating layer 105b may further include a material contained in the Bragg reflector structure 260'.

In the present embodiment, in order to electrically connect or physically connect with an external substrate during the bonding process of the flip chip, a material of the first electrode 140 and the second electrode 150 is, for example, gold/tin (Au/Sn) alloy or other conductive materials applicable in eutectic bonding. Herein, the first electrode 140 and the second electrode 150 can be used for eutectic bonding directly, but they construe no limitation in the invention. In other embodiments, the first electrode 140 and the second electrode 150 may be formed by the same material.

Figure 4:
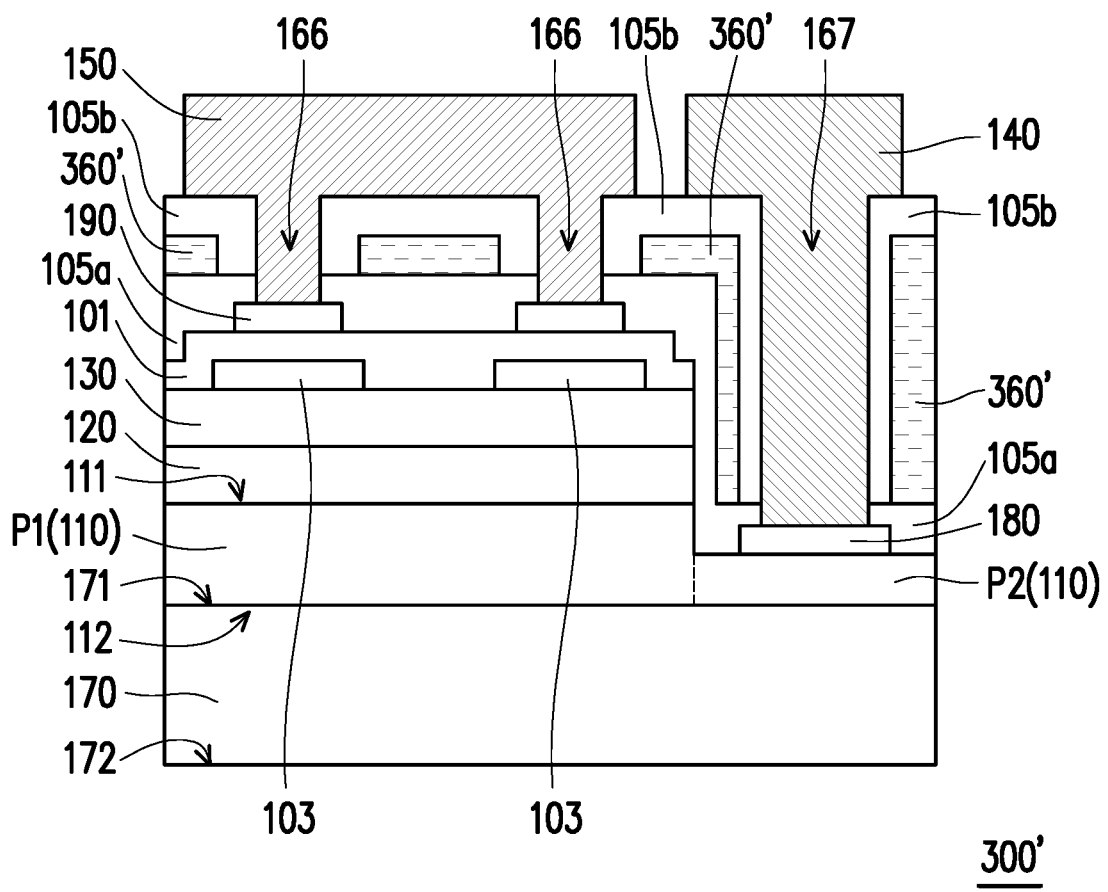
FIG. 4 is a schematic cross-sectional view of an LED according to one other embodiment of the invention.

FIG. 4 is a schematic cross-sectional view of an LED according to one other embodiment of the invention. Referring to FIG. 4, the LED illustrated in FIG. 4 is an LED applicable to flip chip packaging. The LED 300' in the present embodiment is similar to the LED chip 200' in FIG. 3, and the major difference lies in that: the LED 300' further includes a first insulating layer 105a and a second insulating layer 105b, the Bragg reflector structure 360' is disposed between the first insulating layer 105a and the second insulating layer 105b, and the first insulating layer 105a and the second insulating layer 105b may be partially overlapped and in contact with each other. The first insulating layer 105a is disposed on the first-type semiconductor layer 110, the second-type semiconductor layer 130, and sidewalls of the first-type semiconductor layer 110, the emitting layer 120, and the second-type semiconductor layer 130. The first insulating layer 105a may further dispose on part of the first metal layer 180, part of the second metal layer 190, and the conductive layer 101, and the Bragg reflector structure 360' is located between the first insulating layer 105a and the second insulating layer 105b. Furthermore, the second insulating layer 105b may be disposed on the Bragg reflector structure 360', the first insulating layer 105a, part of the first metal layer 180, and part of the second metal layer 190, and the second insulating layer 105b may clad the Bragg reflector structure 360'. In other words, the first-type semiconductor layer 110, the emitting layer 120, the second-type semiconductor layer 130, and the Bragg reflector structure 360' in the present embodiment are sequentially stacked on the first surface 171 of the growth substrate 170. In addition, the through holes 166 penetrate through the second insulating layer 105b and the first insulating layer 105a, so as to allow the second electrode 150 to fill into the through holes 166 and to electrically connect with the second metal layer 190 and the second-type semiconductor layer 130. Similarly, the through holes 167 penetrate through the second insulating layer 105b and the first insulating layer 105a, so as to allow the first electrode 140 to fill into the through holes 167 and to electrically connect with the first metal layer 180 and the first-type semiconductor layer 110. A material of the first insulating layer 105a and the second insulating layer 105b includes, for example, silicon dioxide ($SiO_2$), or the material thereof may be the same material or a material with the same refractive index. Moreover, the material of the first insulating layer 105a and the second insulating layer 105b may further include a material contained in the Bragg reflector structure 360'.

Figure 5:
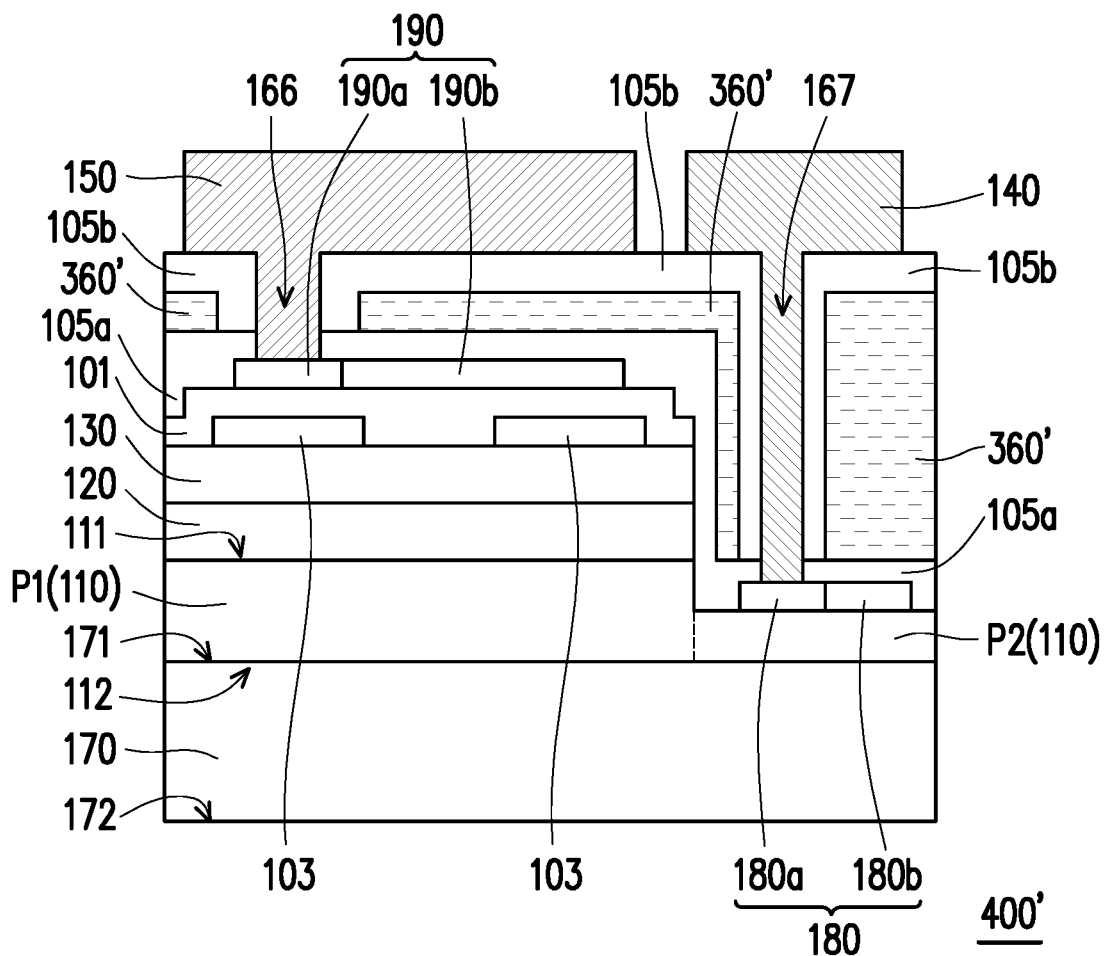
FIG. 5 is a schematic cross-sectional view of an LED according to yet another embodiment of the invention.

FIG. 5 is a schematic cross-sectional view of an LED according to yet another embodiment of the invention. FIG. 5 is a schematic cross-sectional view of an LED according to yet another embodiment of the invention. Referring to FIG. 5, the LED illustrated in FIG. 5 is another LED applicable to flip chip packaging. The LED 400' in the present embodiment is similar to the LED 300' in FIG. 4, and the major difference lies in that: the first metal layer 180 includes a welding portion 180a and a finger portion 180b, the second metal layer 190 includes a welding portion 190a and a finger portion 190b, and the first insulating layer 105a and the second insulating layer 105b may be partially overlapped and in contact with each other. The first insulating layer 105a is disposed on the first-type semiconductor layer 110, the second-type semiconductor layer 130, and sidewalls of the first-type semiconductor layer 110, the emitting layer 120, and the second-type semiconductor layer 130. In addition, the first insulating layer 105a is disposed on part of the first metal layer 180, part of the second metal layer 190, and the conductive layer 101, and the first insulating layer 105 is disposed on part of the welding portion 180a of the first metal layer 180 and the finger portion 180b of first metal layer 180. Part of the Bragg reflector structure 360' is located between the first insulating layer 105a and the second insulating layer 105b. Furthermore, the second insulating layer 105b may be disposed on the Bragg reflector structure 360', the first insulating layer 105a, part of the first metal layer 180, and part of the second metal layer 190, the second insulating layer 105b may further clad the Bragg reflector structure 360', and the second insulating layer 105b is disposed on part of the welding portion 180a of the first metal layer 180 and the finger portion 180b of the first metal layer 180. In other words, the first-type semiconductor layer 110, the emitting layer 120, the second-type semiconductor layer 130, and the Bragg reflector structure 360' in the present embodiment are sequentially stacked on the first surface 171 of the growth substrate 170. The through holes 166 penetrate through the second insulating layer 105b and the first insulating layer 105a, so as to allow the second electrode 150 to fill into the through holes 166 and to electrically connect with the welding portion 190a of the second metal layer 190 and the second-type semiconductor layer 130. The through holes 167 penetrate through the second insulating layer 105b and the first insulating layer 105a, so as to allow the first electrode 140 to fill into the through holes 167 and to electrically connect with the welding portion 180a of the first metal layer 180 and the first-type semiconductor layer 110. A material of the first insulating layer 105a and the second insulating layer 105b includes, for example, silicon dioxide ($SiO_2$), or the material thereof may be the same material or a material with the same refractive index. Moreover, the material of the first insulating layer 105a and the second insulating layer 105b may further include a material contained in the Bragg reflector structure 360'.

Figure 6:
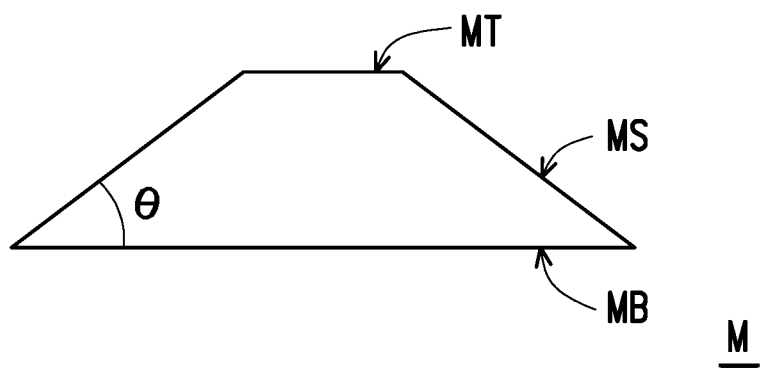
FIG. 6 is a schematic cross-sectional view of a metal layer according to an embodiment of the invention.

FIG. 6 is a schematic cross-sectional view of a metal layer according to an embodiment of the invention. FIG. 6 is a schematic cross-sectional view of a metal layer according to an embodiment of the invention. Referring to FIG. 6, the metal layer M includes a top surface MT, a bottom surface MB, and side surfaces MS. The side surfaces MS and the bottom surface MB form an included angle θ, and the included angle θ may be less than or equal to 60 degree, or less than or equal to 45 degree. For example, the included angle θ can may be 30 degree to 45 degree. The metal layer M can be used in at least one of the first metal layer 180 and the second metal layer 190 in the previous embodiments.

Specifically, when the metal layer M is applied to the first metal layer 180 in FIG. 3, an area of the holes 167 can be set to fall on an area of the top surface MT, and the side surfaces MS may be at least partially covered by the first insulating layer 105a. Meanwhile, since the included angle θ formed by the side surfaces MS and the bottom surface MB may be less than or equal to 60 degree, the first insulating layer 105a can reliably cover on the side surfaces MS. In other words, the first insulating layer 105a has an excellent coverage effect for covering part of the metal layer M. Similarly, when the metal layer M is applied to the second metal layer 190 in FIG. 3 or at least one of the first metal layer 180 and the second metal layer 190 in FIG. 4 and FIG. 5, the similar effects may be provided.

Figure 7:
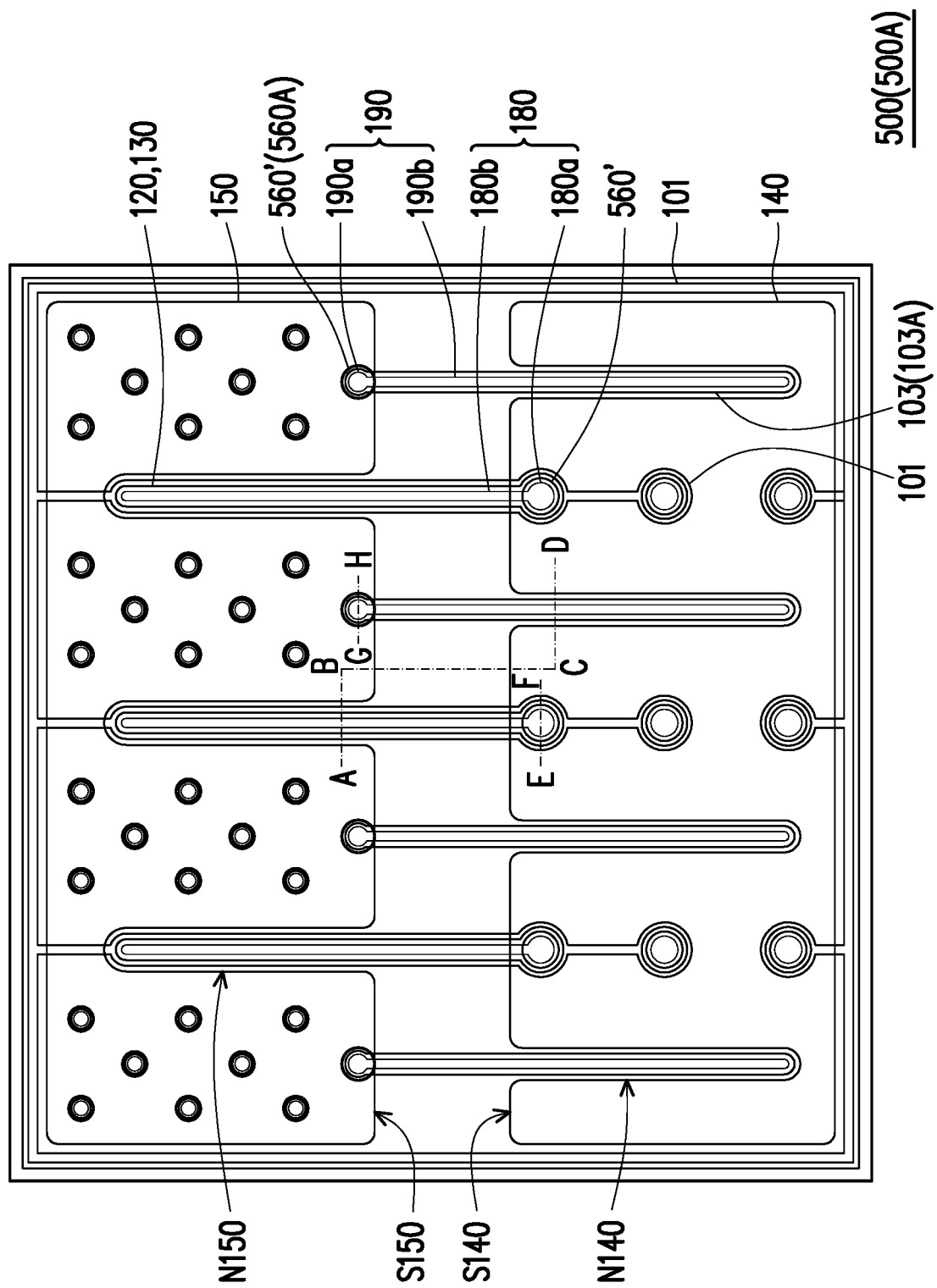
FIG. 7 is a schematic top view of an LED according to an embodiment of the invention.
Figure 8:
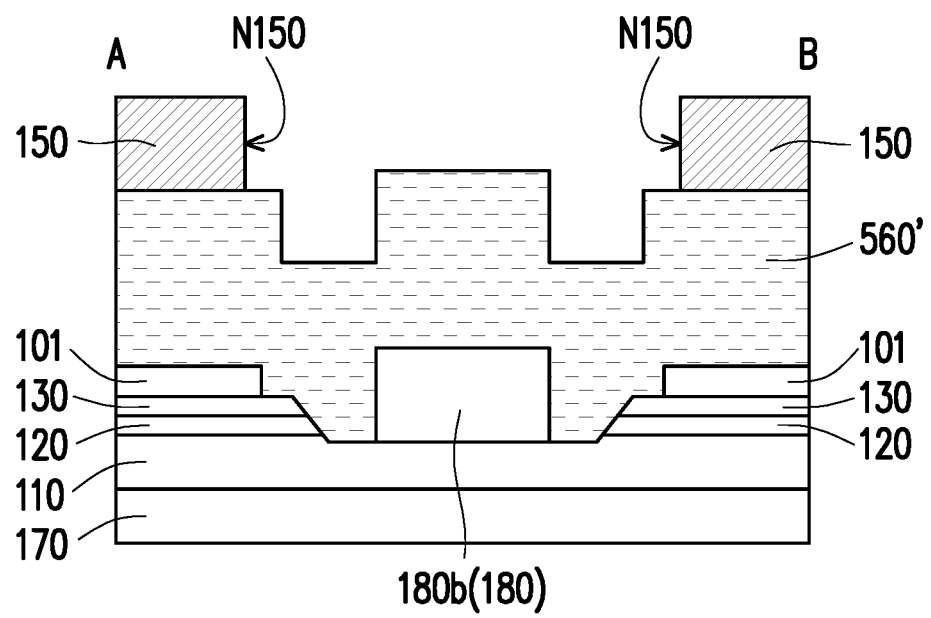
FIG. 8 is a schematic cross-sectional view along a line A-B corresponding to FIG. 7.
Figure 9:
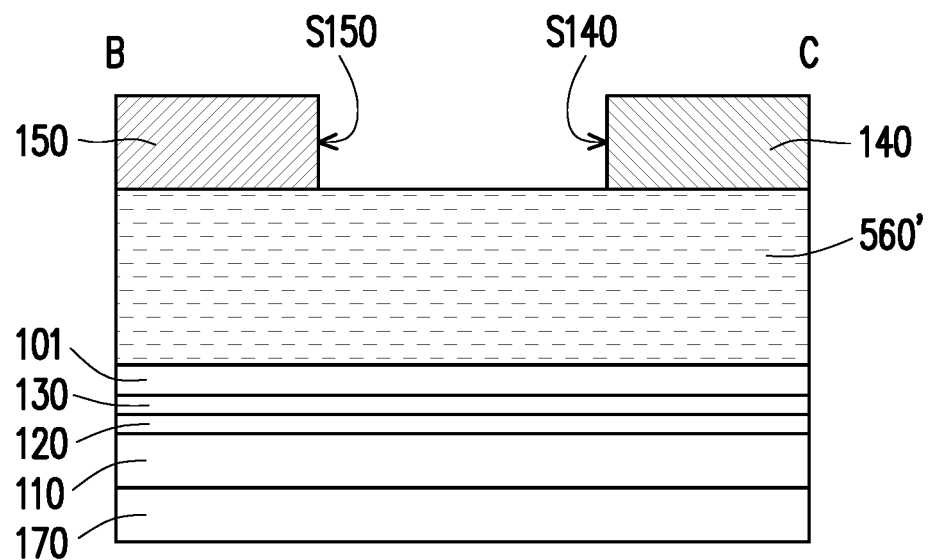
FIG. 9 is a schematic cross-sectional view along a line B-C corresponding to FIG. 7.
Figure 10:
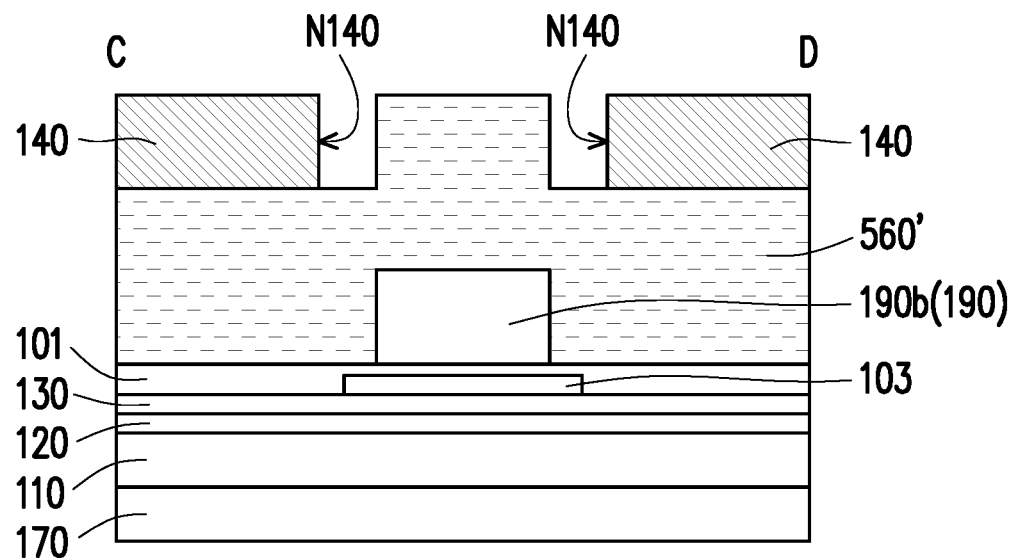
FIG. 10 is a schematic cross-sectional view along a line C-D corresponding to FIG. 7.
Figure 11:
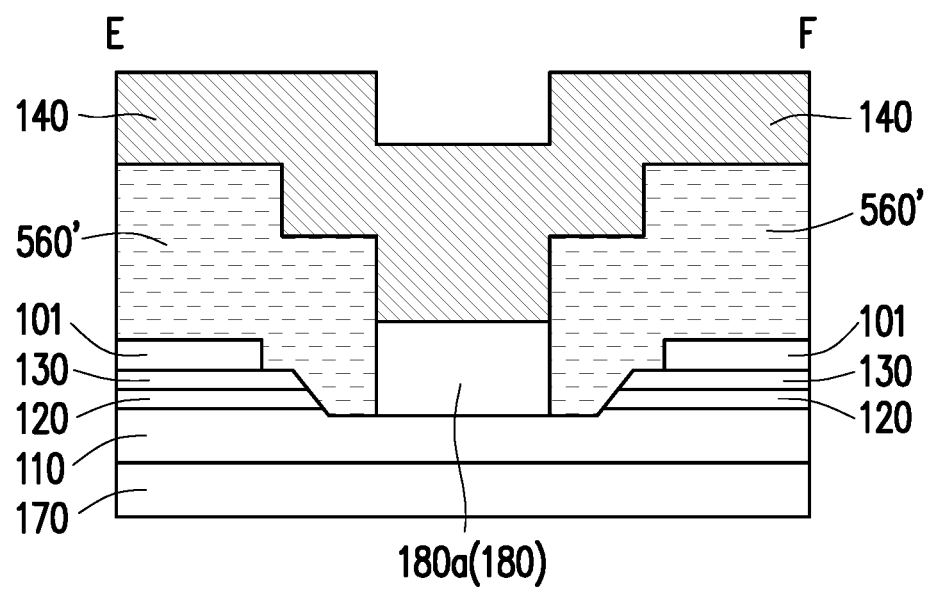
FIG. 11 is a schematic cross-sectional view along a line E-F corresponding to FIG. 7.
Figure 12:
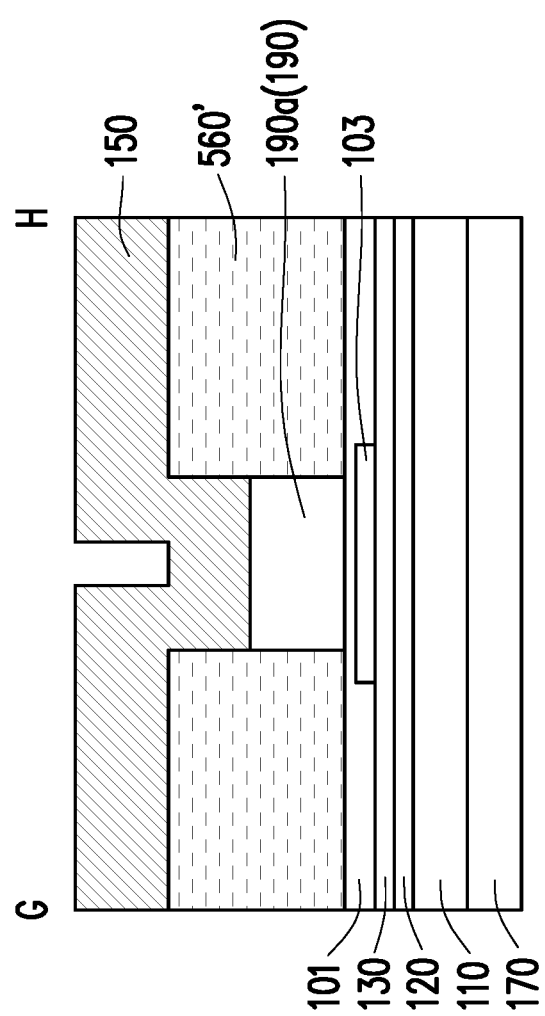
FIG. 12 is a schematic cross-sectional view along a line G-H corresponding to FIG. 7.

FIG. 7 is a schematic top view of an LED according to an embodiment of the invention. FIG. 8 is a schematic cross-sectional view along a line A-B corresponding to FIG. 7. FIG. 9 is a schematic cross-sectional view along a line B-C corresponding to FIG. 7. FIG. 10 is a schematic cross-sectional view along a line C-D corresponding to FIG. 7. FIG. 11 is a schematic cross-sectional view along a line E-F corresponding to FIG. 7. FIG. 12 is a schematic cross-sectional view along a line G-H corresponding to FIG. 7. In the present embodiment, the LED 500 generally includes a conductive layer 110, insulation patterns 103, a first-type semiconductor layer 110, an emitting layer 120, a second-type semiconductor layer 130, a first electrode 140, a second electrode 150, a Bragg reflector structure 560', a growth substrate 170, a first metal layer 180, and a second metal layer 190. Some of the elements are not illustrated in FIG. 7 and are presented in the cross-sectional views corresponding to lines A-B, B-C, C-D, E-F, and G-H.

As illustrated in FIG. 7, the first electrode 140 and the second electrode 150 of the LED 500 are disposed opposite to each other and are separated from each other. The first electrode 140 is substantially rectangular and sidewall S140 of the first electrode 140 facing the second electrode 150 has a plurality of recesses N140. The recesses N140 extend from the sidewall S140 toward an interior of the first electrode 140 but does not penetrate through the first electrode 140. The second electrode 150 is also substantially rectangular and sidewall S150 of the second electrode 150 facing the first electrode 140 has a plurality of recesses N150. The recesses N150 extend from the sidewall S150 toward an interior of the second electrode 150 but does not penetrate through the second electrode 150. A material of the first electrode 140 and the second electrode 150 is, for example, gold (Au), gold/tin (Au/Sn) alloy, or other conductive materials applicable in eutectic bonding. In other embodiments, the first electrode 140 and the second electrode 150 may be formed by the same material, and an additional electrode pad which is used for eutectic bonding can be disposed above the first electrode 140 and the second electrode 150.

In the present embodiment, the welding portion 180a of the first metal layer 180 overlaps the first electrode 140. The finger portion 180b of the first metal layer 180 extends from the welding portion 180a toward the second electrode 190, and in particular, extends into the recesses N150 of the second electrode 150. As illustrated in FIG. 7, the finger portion 180b and the second electrode 150 are not overlapped with each other on the layout area. The welding portion 190a of the second metal layer 190 overlaps the second electrode 150. The finger portion 190b of the second metal layer 190 extends from the welding portion 190a toward the first electrode 180, and in particular, extends into the recesses N140 of the first electrode 140.

As illustrated in FIG. 7, the finger portion 190b and the first electrode 140 are not overlapped with each other on the layout area. A profile of the conductive layer 101 surrounds the first metal layer 180 and does not overlap with the first metal layer 180. The insulation patterns 103 are disposed corresponding to the second metal layer 190, and profiles of the insulation patterns 103 are substantially similar to the profile of the second metal layer 190. Moreover, a profile of the Bragg reflector structure 560' correspondingly exposes the welding portion 180a of the first metal layer 180 and the welding portion 190a of the second metal layer 190. That is, the welding portion 180a of the first metal layer 180 and the welding portion 190a of the second metal layer 190 do not overlap the Bragg reflector structure 560', so as to provide the welding portion 180a of the first metal layer 180 to physically and electrically connect with the first electrode 140 and to provide the welding portion 190a of the second metal layer 190 to physically and electrically connected with the second electrode 150. However, the finger portion 180b of the first metal layer 180 and the finger portion 190b of the second metal layer 190 may overlap the Bragg reflector structure 560'.

As illustrated in FIG. 7 and FIG. 8, in the LED 500, the first-type semiconductor layer 110, the emitting layer 120, the second-type semiconductor layer 130, the conductive layer 101, the Bragg reflector structure 560', and the second electrode 150 are sequentially stacked on the growth substrate 170. In the stacked structure of the first-type semiconductor layer 110, the emitting layer 120, and the second-type semiconductor layer 130, the emitting layer 120 and the second-type semiconductor layer 130 are partially removed and the conductive layer 110 is correspondingly disconnected in this region to expose the first-type semiconductor layer 110. The first metal layer 180 is disposed on the exposed first-type semiconductor layer 110. The first metal layer 180 illustrated in FIG. 8 is the finger portion 180b, the finger portion 180b is correspondingly located within the recesses N150 of the second electrode 150 and thus is not overlapped with the second electrode 150. Moreover, the Bragg reflector structure 560' overlaps the finger portion 180b.

As illustrated in FIG. 7 and FIG. 9, between the sidewall S140 of the first electrode 140 and the sidewall S150 of the second electrode 150, the first-type semiconductor layer 110, the emitting layer 120, the second-type semiconductor layer 130, the conductive layer 101, and the Bragg reflector structure 560' are distributed continuously, and these elements are sequentially stacked on the growth substrate 170.

As illustrated in FIG. 7 and FIG. 10, at the recesses N140 of the first electrode 140, the first-type semiconductor layer 110, the emitting layer 120, the second-type semiconductor layer 130, the insulation patterns 103, the conductive layer 101, the second metal layer 190, and the Bragg reflector structure 560' are sequentially stacked on the growth substrate 170. The profiles of the insulation patterns 103 correspond to the profile of the second metal layer 190 and the two are overlapped with each other. Specifically, the second metal layer 190 illustrated in FIG. 10 is the finger portion 190b of the second metal layer 190, the finger portion 190b is correspondingly located within the recesses N140 of the first electrode 140 and thus is not overlapped with the first electrode 140. Moreover, the Bragg reflector structure 560' overlaps the finger portion 190b.

As illustrated in FIG. 7 and FIG. 11, in the LED 500, the first-type semiconductor layer 110, the emitting layer 120, the second-type semiconductor layer 130, the conductive layer 101, the Bragg reflector structure 560', and the second electrode 150 are sequentially stacked on the growth substrate 170. In the stacked structure of the first-type semiconductor layer 110, the emitting layer 120, and the second-type semiconductor layer 130, the emitting layer 120 and the second-type semiconductor layer 130 are partially removed and the conductive layer 101 and the Bragg reflector structure 560' are correspondingly disconnected in this region to expose the first-type semiconductor layer 110. The first metal layer 180 is disposed on the exposed first-type semiconductor layer 110, and the first electrode 140 is filled into the disconnected location of the conductive layer 101 and the Bragg reflector structure 560' to physically and electrically connect with the first metal layer 180. In FIG. 11, the welding portion 180a of the first metal layer 180 is illustrated. Therefore, as illustrated in FIG. 8 and FIG. 11, the welding portion 180a of the first metal layer 180 is directly in contact and is electrically connected to the first electrode, and the finger portion 180b of the first metal layer 180 is overlapped with the Bragg reflector structure 560' and is not overlapped with any electrode.

As illustrated in FIG. 7 and FIG. 12, in an area occupied by the second electrode 150, the first-type semiconductor layer 110, the emitting layer 120, the second-type semiconductor layer 130, the insulation patterns 103, the conductive layer 101, the second metal layer 190, and the Bragg reflector structure 560' are sequentially stacked on the growth substrate 170. The profiles of the insulation patterns 103 correspond to the profile of the second metal layer 190 and the two are overlapped with each other. Specifically, in FIG. 12, the welding portion 190a of the second metal layer 190 is overlapped with the second electrode 150 and the Bragg reflector structure 560' is disconnected in a region corresponding to the welding portion 190a, so as to allow the welding portion 190a of the second metal layer 190 to physically and electrically connect with the second electrode 150. In other words, the welding portion 190a of the second metal layer 190 is not overlapped with the Bragg reflector structure 560'. Comparatively, in FIG. 10, the welding portion 190b of the second metal layer 190 is overlapped with the Bragg reflector structure 560', but is not overlapped with any electrode.

As illustrated in FIG. 7 to FIG. 12, both the first metal layer 180 and the second metal layer 190 include a part overlapped with the Bragg reflector structure 560' and another part not overlapped with the Bragg reflector structure 560'. The part of the metal layer (180 or 190) overlapped with the Bragg reflector structure 560' does not overlap with the electrode. In this way, the thickness of the LED 500 may be more uniform, which helps to improve the yield when bonding the LED 500 to other components. In addition, in FIG. 7 to FIG. 12, the first insulating layer 105a and the second insulating layer 105b illustrated in FIG. 4 or FIG. 5 may be disposed on top and bottom sides of the Bragg reflector structure 560' additionally, and the limitation where the Bragg reflector structure 560' directly contacts the conductive layer 101, the first electrode 140, the second electrode 150, the first metal layer 180 (finger portion 180b) and the second metal layer 190 (finger portion 190b) is not required. Additionally, the cross-sectional structure of the first metal layer 180 and the second metal layer 190 may include inclined sidewalls MS as illustrated in FIG. 6.

Figure 13:
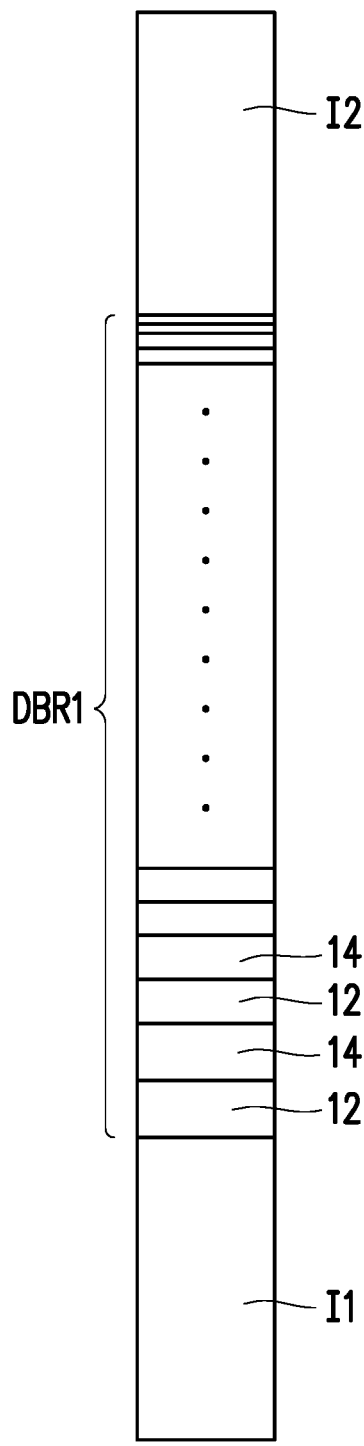
FIG. 13 is a schematic cross-sectional view of a Bragg reflector structure according to an embodiment of the invention.

FIG. 13 is a schematic cross-sectional view of a Bragg reflector structure according to an embodiment of the invention. Referring to FIG. 13, a Bragg reflector structure DBR1 is disposed between a first insulating layer I1 and a second insulating layer I2. The Bragg reflector structure DBR1 includes a plurality of first refractive layers 12 and a plurality of second refractive layers 14, and the first refractive layers 12 and the second refractive layers 14 are stacked alternately. A refractive index of each of the first refractive layers 12 is different from a refractive index of each of the second refractive layers 14. In the present embodiment, thicknesses of the first refractive layers 12 and the second refractive layers 14 decrease as they come closer to the second insulating layer I2. That is, the stacking density of the first refractive layers 12 and the second refractive layers 14 increases as they come closer to the second insulating layer I2 while decreases as they come closer to the first insulating layer I1. As a result, the Bragg reflector structure DBR1 is a structure having a reflective layer density gradually increases form the first insulating layer I1 to the second insulating layer I2.

A material of the first refractive layers 12 in the present embodiment includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof. On the other hand, a material of the second refractive layers 14 includes silicon oxide ($SiO_2$). In the present embodiment, the material of the first insulating layer I1 and the second insulating layer I2 may also be silicon dioxide ($SiO_2$). However, when the material of the second refractive layers 14, the first insulating layer I1, and the second insulating layer I2 are all silicon dioxide ($SiO_2$), a crystallinity and a compactness of the second refractive layers 14 are relatively smaller than the first insulating layer I1 and the second insulating layer I2. The materials and thicknesses of the first refractive layers 12 and the second refractive layers 14 may adjust the reflective wavelength range of the Bragg reflector structure DBR1. Therefore, by adapting the first refractive layers 12 and the second refractive layers 14 having thicknesses gradient in the Bragg reflector structure DBR1 of the present embodiment, the Bragg reflector structure DBR1 may have a broader reflective wavelength range to be suitable in end products requiring light emitting effect in broad wavelength range.

For example, when titanium dioxide ($TiO_2$) is used to fabricate the first reflective layers 12 and silicon dioxide ($SiO_2$) is used to fabricate the second reflective layers 14, the Bragg reflector structure DBR1 with the thickness gradient exhibited in the reflective layers may be applicable to visible light emitting devices. When tantalum pentoxide ($Ta_2O_5$) is used to fabricate the first reflective layers 12 and silicon dioxide ($SiO_2$) is used to fabricate the second reflective layers 14, the Bragg reflector structure DBR1 with the thickness gradient exhibited in the reflective layers may be applicable to ultraviolet light emitting devices. However, the material and the applications on the light emitting devices described above are merely used as examples, and in actuality, when the Bragg reflective DBR1 is fabricated by other materials, the application thereof may be adjusted based on the reflective wavelength range exhibited.

Figure 14:
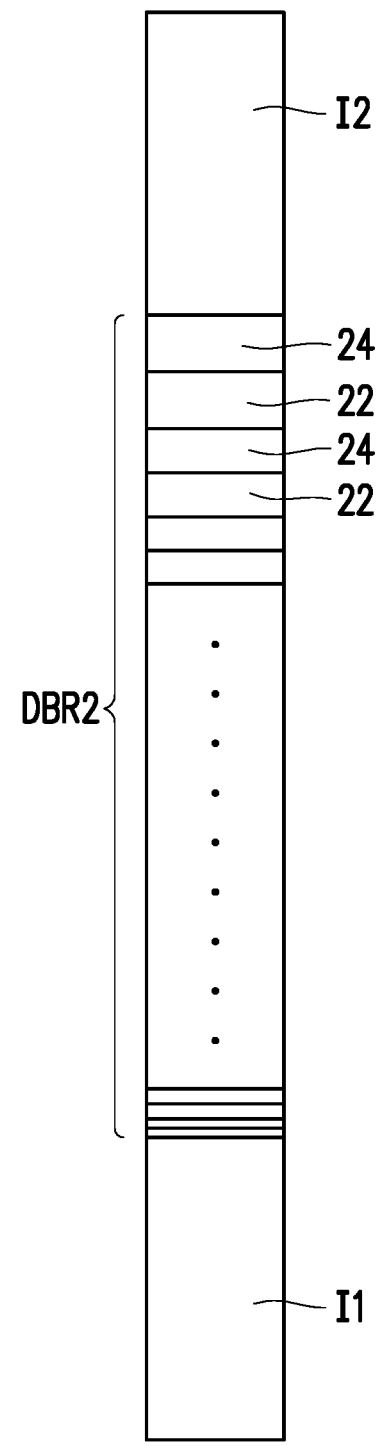
FIG. 14 is a schematic cross-sectional view of a Bragg reflector structure according to another embodiment of the invention.

FIG. 14 is a schematic cross-sectional view of a Bragg reflector structure according to another embodiment of the invention. Referring to FIG. 14, a Bragg reflector structure DBR2 is disposed between a first insulating layer I1 and a second insulating layer I2. The Bragg reflector structure DBR1 includes a plurality of first refractive layers 22 and a plurality of second refractive layers 24, and the first refractive layers 22 and the second refractive layers 24 are stacked alternately. A refractive index of each of the first refractive layers 22 is different from a refractive index of each of the second refractive layers 24. In the present embodiment, the thicknesses of the first refractive layers 22 and the second refractive layers 24 increases as they come closer to the second insulating layer I2. That is, the stacking density of the first refractive layers 22 and the second refractive layers 24 decreases as they come closer to the second insulating layer I2 while increases as they come closer to the first insulating layer I1. As a result, the Bragg reflector structure DBR2 is a structure having a reflective layer density gradually decreases form the first insulating layer I1 to the second insulating layer I2.

The materials and thicknesses of the first refractive layers 22 and the second refractive layers 24 may adjust the reflective wavelength range of the Bragg reflector structure DBR2. A material of the first refractive layers 12 includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof. On the other hand, a material of the second refractive layers 24 includes silicon oxide ($SiO_2$).

Figure 15:
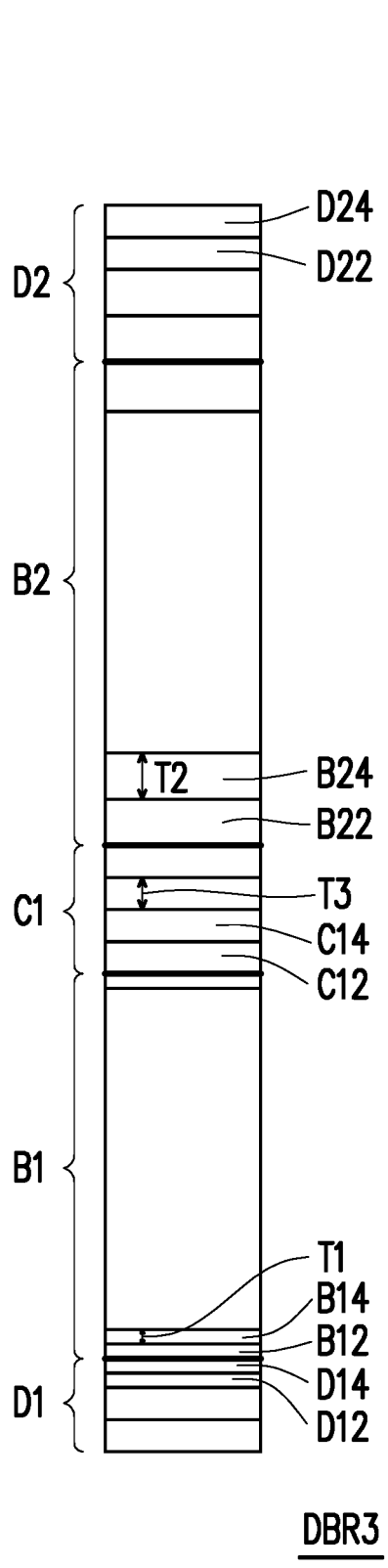
FIG. 15 is a schematic cross-sectional view of a Bragg reflector structure according to one other embodiment of the invention.

FIG. 15 is a schematic cross-sectional view of a Bragg reflector structure according to one other embodiment of the invention. Referring to FIG. 15, a Bragg reflector structure DBR3 includes primary stacked layers B1, B2, a buffer stacked layer C1, and repair stacked layers D1, D2. The primary stacked layer B1 is formed by alternately stacking first refractive layers B12 and second refractive layers B14 having a refractive index different from the first refractive layers B12 in a repeating manner. The primary stacked layer B2 is formed by alternately stacking first refractive layers B22 and second refractive layers B24 having a refractive index different from the first refractive layers B22 in a repeating manner. The buffer stacked layer C1 is formed by alternately stacking third refractive layers C12 and fourth refractive layers C14 having a refractive index different from the third refractive layers C12 in a repeating manner. The repair stacked layer D1 is formed by alternately stacking fifth refractive layers D12 and sixth refractive layers D14 having a refractive index different from the fifth refractive layers D12 in a repeating manner. The repair stacked layer D2 is formed by alternately stacking fifth refractive layers D22 and sixth refractive layers D24 having a refractive index different from the fifth refractive layers D22 in a repeating manner.

In the present embodiment, the first refractive layers B12 and B22, the third refractive layers C12, and the fifth refractive layers D11 and D12 in the same Bragg reflector structure DBR3 may have the same material or different materials. The material thereof includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof. The second refractive layers B14 and B24, the fourth refractive layers C14, and the sixth refractive layers D14 and D24 in the same Bragg reflector structure DBR3 may have the same material or different materials, and the material thereof includes silicon dioxide ($SiO_2$).

In addition, in the primary stacked layer B1, each of the first reflective layers B12 has an equal first thickness T1 and the second reflective layer B14 has the equal first thickness T1. In the primary stacked layer B2, each of the first reflective layers B22 has an equal second thickness T2 and the second reflective layer B24 has the equal second thickness T2. Moreover, the first thickness T1 is different from the second thickness T2. In other words, a single primary stacked layer B1 or B2 has periodically stacked reflective layers, but the stacked period of the reflective layers in different primary stacked layers are different. As a result, by stacking multiple primary stacked layer B1, B2, the Bragg reflector structure DBR3 is capable to providing a broad reflective wavelength range.

In the buffer stacked layer C1 between the primary stacked layer B1 and the primary stacked layer B2, the third reflective layers C12 and the fourth reflective layers C14 have a third thickness T3. The third thickness T3 may be an average value of the first thickness T1 and the second thickness T2. In other words, T3=½(T1+T2). However, the thicknesses of the third reflective layers C12 and the fourth reflective layers C14 may be respectively between the first thickness T1 and the second thickness T2.

Moreover, the thicknesses of the fifth reflective layers D12 and the sixth reflective layers D14 in the repair stacked layer D1 may approach the first thickness T1 as they come closer to the primary stacked layer B1. The thicknesses of the fifth reflective layers D22 and the sixth reflective layers D24 in the repair stacked layer D2 may approach the second thickness T2 as they come closer to the primary stacked layer B2. That is, the repair stacked layer D1 and the repair stacked layer D2 are stacked structures having thickness gradient in the reflective layers. Moreover, the material composition of the repair stacked layer D1 can be related to the primary stacked layer B1, and the material composition of the repair stacked layer D2 can be related to the primary stacked layer B2.

Figure 16:
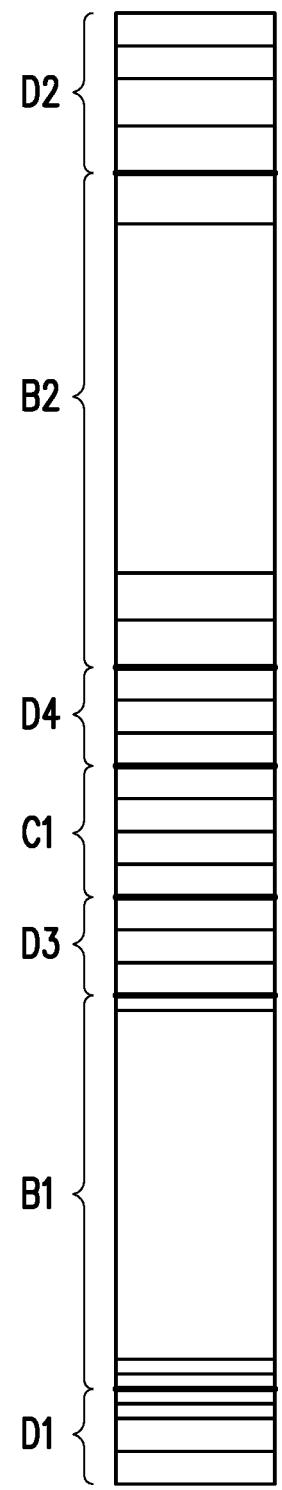
FIG. 16 is a schematic cross-sectional view of a Bragg reflector structure according to yet another embodiment of the invention.

FIG. 16 is a schematic cross-sectional view of a Bragg reflector structure according to yet another embodiment of the invention. Referring to FIG. 16, a Bragg reflector structure DBR4 is similar to the foregoing Bragg reflector structure DBR3, but the Bragg reflector structure DBR4 further includes a repair stacked layer D3 and a repair stacked layer D4. The repair stacked layer D3 is located between the buffer stacked layer C1 and the primary stacked layer B1, and the repair stacked layer D4 is located between the buffer stacked layer C1 and the primary stacked layer B2. The thicknesses of the reflective layers of the repair stacked layer D3 may approach the first thickness T1 as they come closer to the primary stacked layer B1. The thicknesses of the reflective layers of the repair stacked layer D4 may approach the second thickness T2 as they come closer to the primary stacked layer B2. Moreover, the material composition of the repair stacked layer D3 can be related to the primary stacked layer B1, and the material composition of the repair stacked layer D4 can be related to the primary stacked layer B2.

The Bragg reflector structures DBR1~DBR4 in FIG. 13 to FIG. 16 may be applicable to any one of the LEDs in FIGS. 1, 2, 3, 4, 5, and 7. That is, any one of the Bragg reflector structures presented in the foregoing embodiments can be achieved by adapting the Bragg reflector structures DBR1~DBR4 in FIG. 13 to FIG. 16. Under the condition where the Bragg reflector structure has a stacked structure with thickness gradient in reflective layers or has a stacked structure by multiple reflective layers having different thicknesses, the Bragg reflector structure is capable to providing a broader reflective wavelength range.

Figure 17:
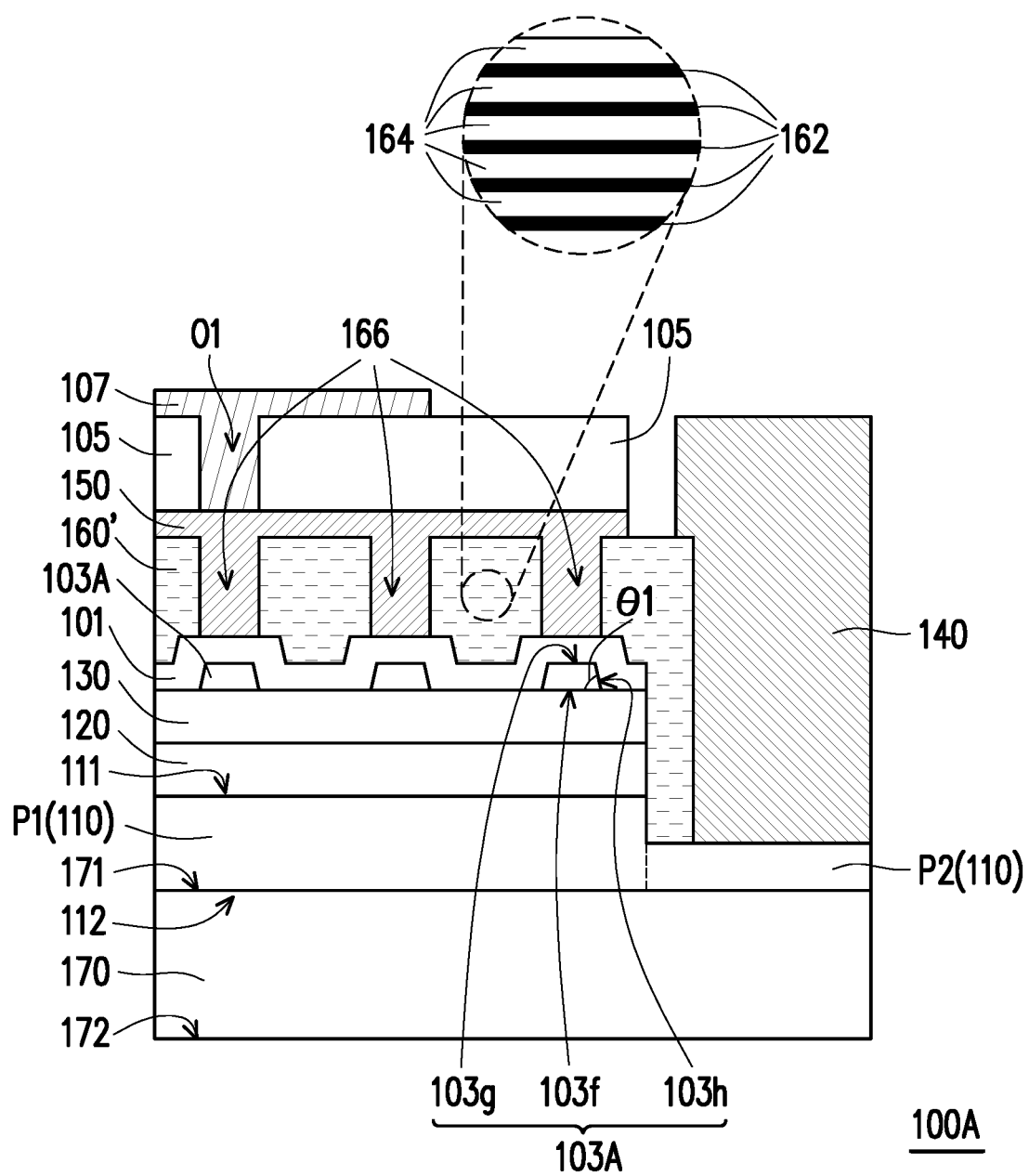
FIG. 17 is a schematic cross-sectional view of an LED according to an embodiment of the invention.

FIG. 17 is a schematic cross-sectional view of an LED according to an embodiment of the invention. An LED 100A of FIG. 17 is similar to the LED 100 of FIG. 2. Therefore, like or corresponding components are referred to with like or corresponding symbols. The LED 100A differs from the LED 100 in that insulation patterns 103A of the LED 100A differ from the insulation patterns 103 of the LED 100. The following descriptions mainly focus on the difference. Like or corresponding parts may be referred to the previous descriptions based on the symbols in FIG. 17, and will not be repeated in the following.

Referring to FIG. 17, the LED 100A includes the growth substrate 170, the first-type semiconductor layer 110, the emitting layer 120, the second-type semiconductor layer 130, the first electrode 140, the second electrode 150, a Bragg reflector structure 160', the insulation patterns 103A, the conductive layer 101, the insulating layer 105, and the electrode pad 107. The emitting layer 120 is located between the first-type semiconductor layer 110 and the second-type semiconductor layer 130. The first electrode 140 is electrically connected to the first-type semiconductor layer 110. The second electrode 150 is electrically connected to the second-type semiconductor layer 130. The first electrode 140 and the second electrode 150 are located on the same side of the Bragg reflector structure 160'. The Bragg reflector structure 160' is located between the second electrode 150 and the second-type semiconductor layer 130. The conductive layer 101 is disposed between the Bragg reflector structure 160' and the second-type semiconductor layer 130. The insulation patterns 130A are disposed between the conductive layer 101 and the second-type semiconductor layer 130. An area of the conductive layer 101 outside of the insulation patterns 103A contacts the second-type semiconductor layer 130. The insulating layer 105 has a through hole O1, and the electrode pad 107 is filled into the through hole O1, so that the electrode pad 107 is electrically connected to the second electrode 150.

In particular, the Bragg reflector structure 160' has the through hole 166. In the present embodiment, the first type semiconductor layer 110, the emitting layer 120, the second type semiconductor layer 130, and the Bragg reflector structure 160' may be sequentially stacked on the first surface 171 of the growth substrate 170. The second electrode 150 is filled into the through holes 166 to electrically connect with the second-type semiconductor layer 130. The second electrode 150 filled into the through holes 166 may contact the conductive layer 101 to be electrically connected to the second-type semiconductor 130 via the conductive layer 101.

Referring to FIG. 17, what differs from the LED 100 is that the insulation pattern 130A has a first surface 103$f$ facing toward the second-type semiconductor layer 130 and a second surface 103$g$ facing away from the second-type semiconductor layer 130. In particular, the insulation pattern 103A further includes an inclined surface 103$h$ connecting the first surface 103$f$ and the second surface 103$g$. The inclined surface 103$h$ is inclined with respect to the first surface 103$f$ and the second surface 103$g$. The insulation patterns 103A are capable to blocking a current. The conductive layer 101 and the insulation patterns 103A may be disposed to disperse the current, so as to avoid the current from concentrating at certain part of the emitting layer 120, thereby allowing uniform distribution of the light emitting region of the emitting layer 120.

In particular, as shown in FIG. 17, the first surface 103$f$ is in contact with the second-type semiconductor layer 130 and not in contact with the conductive layer 101. The second surface 103$g$ and the inclined surface 103$h$ are in contact with the conductive layer 101 and not in contact with the second-type semiconductor layer 130. An orthogonal projection area of the first surface 103$f$ on the second-type semiconductor layer 130 is greater than an orthogonal projection area of the second surface 103$g$ on the second-type semiconductor layer 130, and the inclined surface 103$h$ connects an edge of the area of the first surface 103$f$ and an edge of the area of the second surface 103$g$. An acute angle θ1 in the material of the insulation pattern 103A is formed between the inclined surface 103$h$ and the first surface 103$f$. In this embodiment, 10°≤θ1≤80°, and preferably 30°≤θ1≤50°. However, the invention is not limited thereto.

Figure 18A:
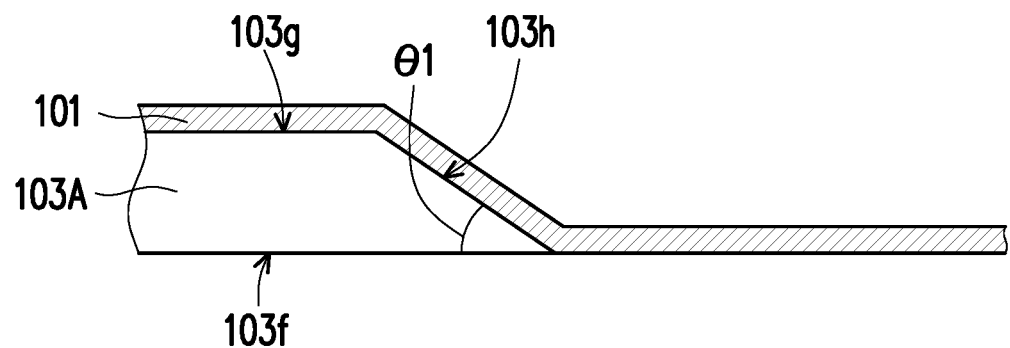
FIG. 18A is a schematic enlarged view of an insulation pattern and a conductive layer according to an embodiment of the invention.
Figure 18B:
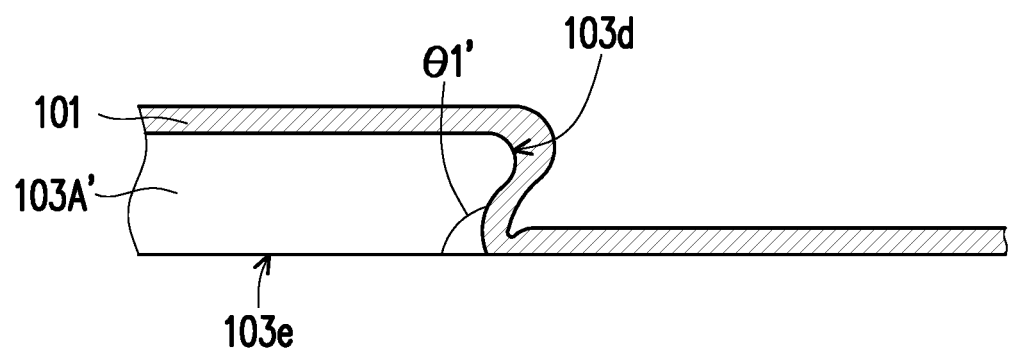
FIG. 18B is a schematic enlarged view of an insulation pattern and a conductive layer of a comparative example.

FIG. 18A is a schematic enlarged view of an insulation pattern and a conductive layer according to an embodiment of the invention. FIG. 18B is a schematic enlarged view of an insulation pattern and a conductive layer of a comparative example. Referring to FIGS. 18A and 18B, in the comparative example of FIG. 18B, an angle θ1' is formed between a sidewall 103$d$ and a bottom surface 103$e$ of the insulation pattern 103A', and θ1'≥90°. In the case that θ1'≥90°, when the conductive layer 101 covers the insulation pattern 103A', the coverage of the conductive layer 101 on the sidewall 103$d$ of the insulation pattern 103A' may be bad, and the coverage may be discontinued, instead of continuous, at the sidewall 103$d$, thereby jeopardizing the electrical and optical properties of the LED chip and the reliability thereof. Comparatively, referring to FIG. 18A, the insulation pattern 103A has the inclined surface 103$h$ in this embodiment. The acute angle θ1 in the material of the insulation pattern 103A is formed between the inclined surface 103$h$ and the first surface 103$f$. In the case that θ1' is smaller than 90°, when the conductive layer 101 covers the insulation pattern 130A, the coverage of the conductive layer 101 on the inclined surface 103h is preferable. Therefore, the electrical and optical properties of the LED chip 100A and the reliability thereof may be enhanced. For example, with the preferable coverage of the conductive layer 101 on the inclined surface 103h, a driving voltage of the LED chip 100A may be lowered, uniformity of current density and brightness may be enhanced, and heat concentration at a certain area may be avoided. In addition, the preferable coverage of the conductive layer 101 also is also beneficial in formation of a process window of a layer on the conductive layer 101 subsequently.

Figure 19A:
FIG. 19A is a schematic view illustrating an insulation pattern according to an embodiment of the invention.

FIG. 19A is a schematic view illustrating an insulation pattern according to an embodiment of the invention. Referring to FIG. 19A, an insulation pattern 103A1 includes a plurality of first sub-layers SL1 and a plurality of sub-layers SL2. The first sub-layers SL1 and the second sub-layers SL2 are alternately stacked. A material of the first sub-layers SL1 and a material of the second sub-layers SL2 may differ from each other. The material of the first sub-layers SL1 includes tantalum pentoxide ($Ta_2O_5$), zirconium dioxide ($ZrO_2$), niobium pentoxide ($Nb_2O_5$), hafnium oxide ($HfO_2$), titanium dioxide ($TiO_2$), or combinations thereof. The material of the second sub-layers SL2 includes silicon oxide ($SiO_2$).

When the insulation pattern 103A1 are manufactured by using the first sub-layers SL1 and the second sub-layers SL2 formed of different materials, a lift-off process may be selectively performed to form the insulation pattern 103A1 having the inclined surface 103h. In this embodiment, a refractive index of the first sub-layers SL1 is different from a refractive index of the second sub-layers SL2. In this way, the insulation pattern 103A1 is capable of providing Bragg reflection. When the insulation pattern 103A1 is used in the LED 100A of FIG. 17, the insulation pattern 103A1 capable of providing Bragg reflection may reflect a beam emitted from the emitting layer 120 toward the second electrode 150 elsewhere, so that the light beam emitted from the emitting layer 120 is less likely to be blocked by the light-shielding second electrode 150 and may be emitted elsewhere. Therefore, the brightness of the LED chip 100A may be increased.

Figure 19B:
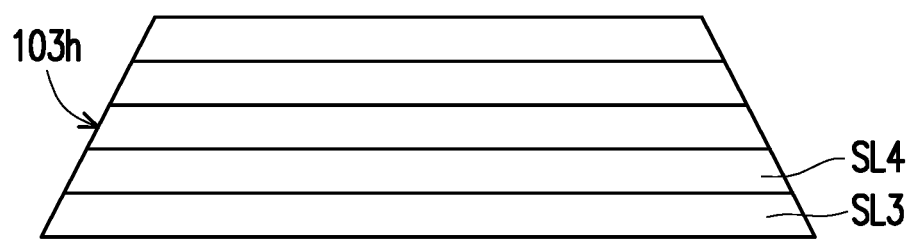
FIG. 19B is a schematic view illustrating an insulation pattern according to another embodiment of the invention.

As for other embodiments, FIG. 19B, for example, is a schematic view illustrating an insulation pattern according to another embodiment of the invention. Materials of first sub-layers SL3 and second sub-layers SL4 of an insulation pattern 103A2 may be the same, whereas densities of the first sub-layers SL3 and the second sub-layers may be different. The material of the insulation pattern 103A2 includes, for example, silicon dioxide ($SiO_2$) or other materials having characteristic of current blocking.

Desired densities of the first sub-layers SL3 and the second sub-layers SL4 formed of the same material but having different densities may be achieved by modulating process parameters (e.g., temperature, pressure, time, etc.). When the first sub-layers SL3 and the second sub-layers SL4 formed of the same material but having different densities are used to manufacture the insulation pattern 103A2, an etching process for patterning may be performed to form the insulation pattern 103A2. Since the first sub-layers SL3 and the second sub-layers SL4 have different densities, when the first sub-layers SL3 and the second sub-layers SL4 are etched at the same time, the sub-layers having a higher density (e.g., SL3) have a greater residual area, and the sub-layers having a lower density (SL4) have a smaller residual area. Thus, the insulation pattern 103A2 may exhibit a structure having the inclined surface 103h.

Figure 20:
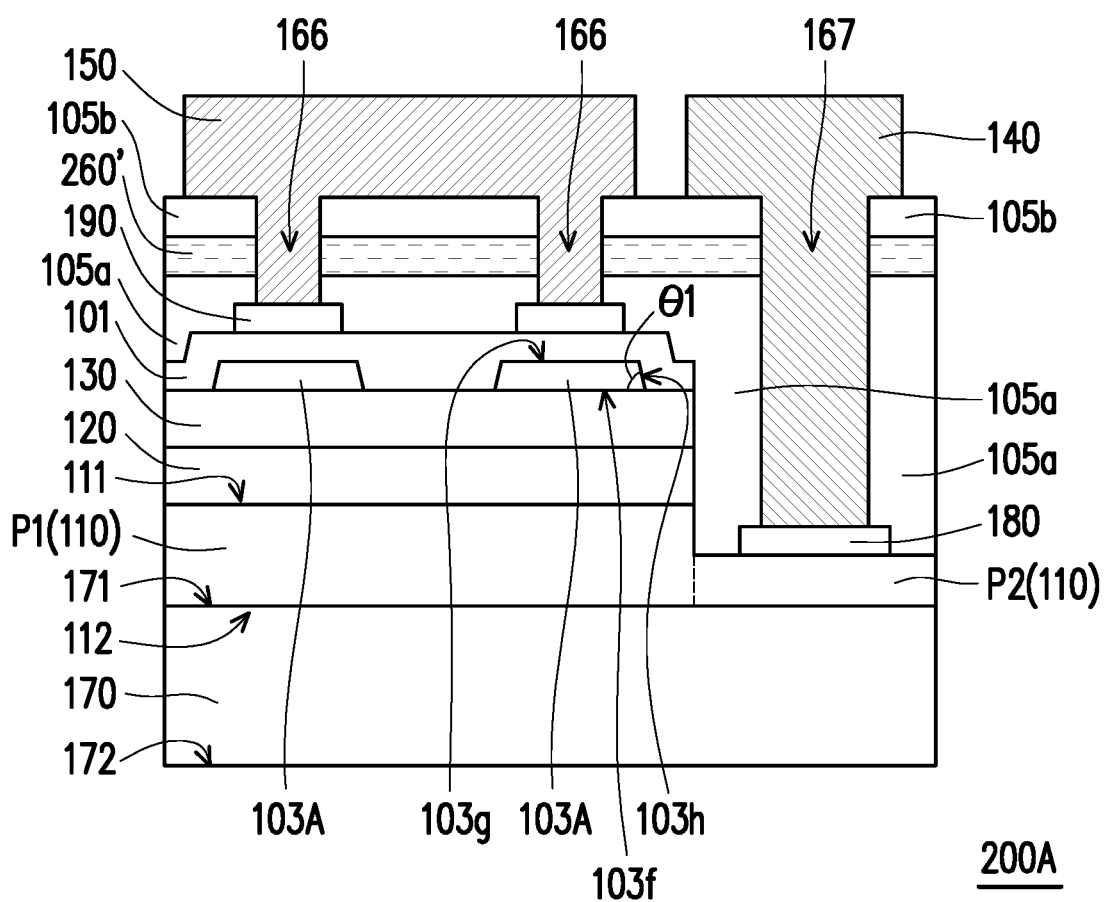
FIG. 20 is a schematic cross-sectional view of an LED according to an embodiment of the invention.

FIG. 20 is a schematic cross-sectional view of an LED according to an embodiment of the invention. An LED 200A of FIG. 20 is similar to the LED 200' of FIG. 3. Therefore, like or corresponding components are referred to with like or corresponding symbols. The LED 200A differs from the LED 200' in that the insulation patterns 103A of the LED 200A differ from the insulation patterns 103 of the LED 200'. The following descriptions mainly focus on the difference. Like or corresponding parts may be referred to the previous descriptions based on the symbols in FIG. 20, and will not be repeated in the following.

Referring to FIG. 20, the LED 200A includes the growth substrate 170, the first-type semiconductor layer 110, the emitting layer 120, the second-type semiconductor layer 130, the first electrode 140, the second electrode 150, a Bragg reflector structure 260', the insulation patterns 103A, the conductive layer 101, the first insulating layer 105a, the second insulating layer 105b, at least one first metal layer 180, and at least one second metal layer 190.

The emitting layer 120 is located between the first-type semiconductor layer 110 and the second-type semiconductor layer 130. The first electrode 140 is electrically connected to the first-type semiconductor layer 110. The second electrode 150 is electrically connected to the second-type semiconductor layer 130. The first electrode 140 and the second electrode 150 are located on the same side of the Bragg reflector structure 260'.

The first insulating layer 105a is disposed on the first-type semiconductor layer 110, the second-type semiconductor layer 130, and sidewalls of the first-type semiconductor layer 110, the emitting layer 120, and the second-type semiconductor layer 130. The first insulating layer 105a may further dispose on part of the first metal layer 180, part of the second metal layer 190, and the conductive layer 101, and at least part of the Bragg reflector structure 260' is located between the first insulating layer 105a and the second insulating layer 105b. The first metal layer 180 is located between the first electrode 140 and the first-type semiconductor layer 110, the second metal layer 190 is located between the second electrode 150 and the second-type semiconductor layer 130, and part of the Bragg reflector structure 260' is located on the first metal layer 180 or the second metal layer 190.

The Bragg reflector structure 260' has the through holes 166 between the second electrode 150 and the second-type semiconductor layer 130 and the through holes 167 between the first electrode 140 and the first-type semiconductor layer 110. In the present embodiment, the first type semiconductor layer 110, the emitting layer 120, the second type semiconductor layer 130, and the Bragg reflector structure 260' may be sequentially stacked on the first surface 171 of the growth substrate 170. The second electrode 150 is filled into the through holes 166 to electrically connect with the second-type semiconductor layer 130. The first electrode 140 is filled into the through holethrough holes 167 to electrically connect with the first-type semiconductor layer 110.

What differs from the LED 200' is that the insulation pattern 130A has the first surface 103f facing toward the second-type semiconductor layer 130 and the second surface 103g facing away from the second-type semiconductor layer 130. In particular, the insulation pattern 103A further includes the inclined surface 103h connecting the first surface 103f and the second surface 103g. The inclined surface 103h is inclined with respect to the first surface 103f and the second surface 103g. The insulation patterns 103A are capable to blocking a current. The conductive layer 101 and the insulation patterns 103A may be disposed to disperse the current, so as to avoid the current from concentrating at certain part of the emitting layer 120, thereby allowing uniform distribution of the light emitting region of the emitting layer 120. In particular, the insulation pattern 103 may be configured based on FIG. 19A or FIG. 19B.

Figure 21:
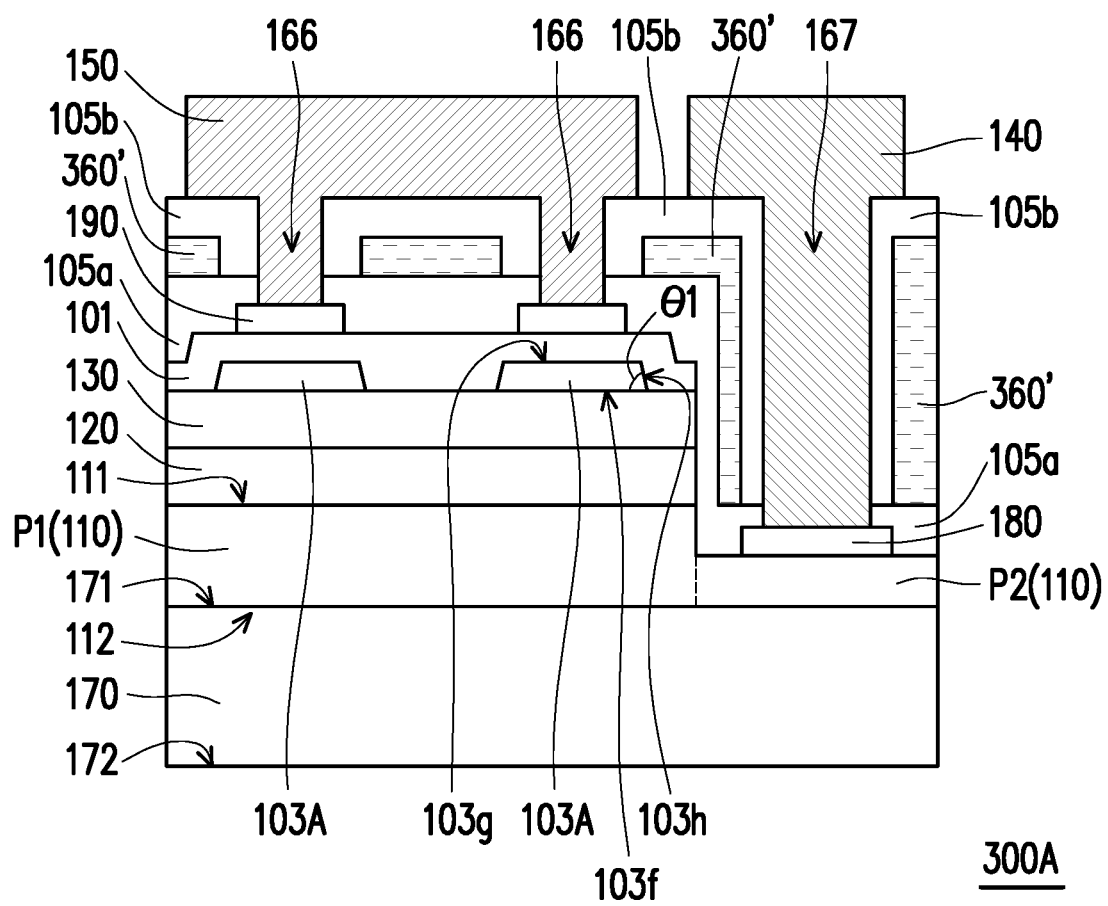
FIG. 21 is a schematic cross-sectional view of an LED according to an embodiment of the invention.

FIG. 21 is a schematic cross-sectional view of an LED according to an embodiment of the invention. An LED 300A of FIG. 21 is similar to the LED 300' of FIG. 4. Therefore, like or corresponding components are referred to with like or corresponding symbols. The LED 300A differs from the LED 300' in that the insulation patterns 103A of the LED 300A differ from the insulation patterns 103 of the LED 300'. The following descriptions mainly focus on the difference. Like or corresponding parts may be referred to the previous descriptions based on the symbols in FIG. 21, and will not be repeated in the following.

Referring to FIG. 21, The LED 300A includes the first-type semiconductor layer 110, the emitting layer 120, the second-type semiconductor layer 130, the first electrode 140, the second electrode 150, and a Bragg reflector structure 360'. The emitting layer 120 is located between the first-type semiconductor layer 110 and the second-type semiconductor layer 130. The first electrode 140 is electrically connected to the first-type semiconductor layer 110. The second electrode 150 is electrically connected to the second-type semiconductor layer 130. The first electrode 140 and the second electrode 150 are located on the same side of a Bragg reflector structure 360'.

In the present embodiment, the LED 300A further includes the insulation patterns 103A. The insulation patterns 130A are disposed between the conductive layer 150 and the second-type semiconductor layer 130. The LED 300A further includes the first insulating layer 105a and the second insulating layer 105b. The Bragg reflector structure 360' is disposed between the first insulating layer 105a and the second insulating layer 105b. The first insulating layer 105a and the second insulating layer 105b may be partially overlapped and in contact with each other. The first insulating layer 105a is disposed on the first-type semiconductor layer 110 and the second-type semiconductor layer 130, and covers sidewalls of the first-type semiconductor layer 110, the emitting layer 120, and the second-type semiconductor layer 130. The second insulating layer 105b may be disposed on the Bragg reflector structure 360'. The through holes 166 penetrate through the second insulating layer 105b and the first insulating layer 105a. The second electrode 150 is filled into the through holes 166 to electrically connect with the second metal layer 190 and the second-type semiconductor layer 130. The through holes 167 penetrate through the second insulating layer 105b and the first insulating layer 105a. The first electrode 140 is filled into the through holes 167 to electrically connect with the first metal layer 180 and the first-type semiconductor layer 110.

What differs from the LED 300' is that the insulation pattern 130A has the first surface 103f facing toward the second-type semiconductor layer 130 and the second surface 103g facing away from the second-type semiconductor layer 130. In particular, the insulation pattern 103A further includes the inclined surface 103h connecting the first surface 103f and the second surface 103g. The inclined surface 103h is inclined with respect to the first surface 103f and the second surface 103g. The insulation patterns 103A are capable to blocking a current. The conductive layer 101 and the insulation patterns 103A may be disposed to disperse the current, so as to avoid the current from concentrating at certain part of the emitting layer 120, thereby allowing uniform distribution of the light emitting region of the emitting layer 120. In particular, the insulation pattern 103 may be configured based on FIG. 19A or FIG. 19B.

Figure 22:
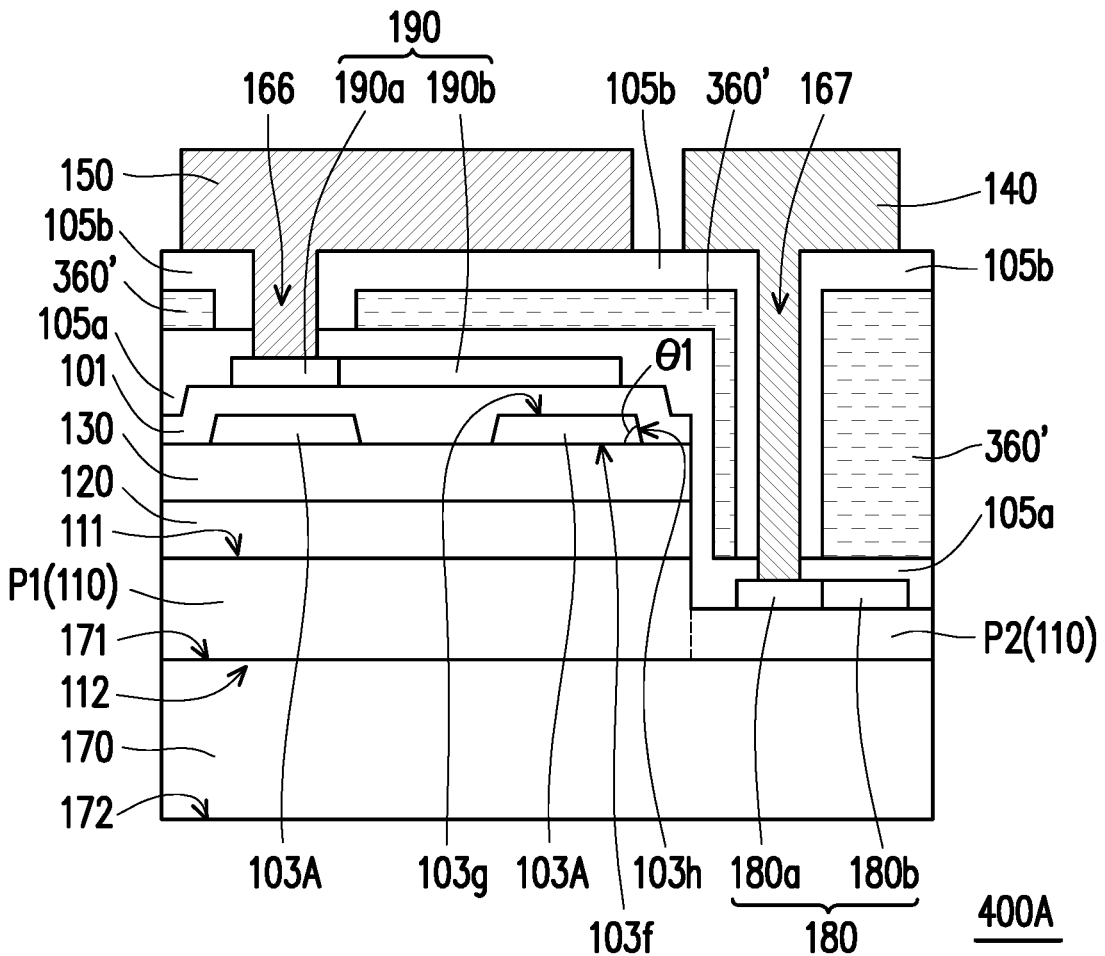
FIG. 22 is a schematic cross-sectional view of an LED according to an embodiment of the invention.

FIG. 22 is a schematic cross-sectional view of an LED according to an embodiment of the invention. An LED 400A of FIG. 22 is similar to the LED chip 300A of FIG. 21. Therefore, like or corresponding components are referred to with like or corresponding symbols. Main differences between the LED 400A and the LED chip 300A are described as follows. In the LED 400A, the first metal layer 180 includes the welding portion 180a and the finger portion 180b. The second metal layer 190 includes the welding portion 190a and the finger portion 190b. The first insulating layer 105a and the second insulating layer 105b may be partially overlapped and in contact with each other. The first insulating layer 105a is disposed on the first-type semiconductor layer 110 and the second-type semiconductor layer 130, and covers sidewalls of the first-type semiconductor layer 110, the emitting layer 120, and the second-type semiconductor layer 130. The first insulating layer 105a is disposed on part of the first metal layer 180, part of the second metal layer 190, and the conductive layer 101.

More specifically, the first insulating layer 105a is disposed on part of the welding portion 180a of the first metal layer 180 and the finger portion 180b of the first metal layer 180. Part of the Bragg reflector structure 360' is located between the first insulating layer 105a and the second insulating layer 105b. The second insulating layer 105b may be disposed on the Bragg reflector structure 360'. The second insulating layer 105b may encapsulate the Bragg reflector structure 360'. The second insulating layer 105b is disposed above part of the welding portion 180a of the first metal layer 180 and the finger portion 180b of the first metal layer 180.

The through holes 166 penetrate through the second insulating layer 105b and the first insulating layer 105a. The second electrode 150 is filled into the through holes 166 to electrically connect with the welding portion 190a of the second metal layer 190 and the second-type semiconductor layer 130. The through holes 167 penetrate through the second insulating layer 105b and the first insulating layer 105a. The first electrode 140 is filled into the through holes 167 to electrically connect with the welding portion 180a of the first metal layer 180 and the first-type semiconductor layer 110. Effects and characteristics of the LED 400A are similar to those of the LED 300A. Thus, details in these respects will not be repeated in the following. What differs from the LED 300' is that the insulation pattern 130A has the first surface 103f facing toward the second-type semiconductor layer 130 and the second surface 103g facing away from the second-type semiconductor layer 130. In particular, the insulation pattern 103A further includes the inclined surface 103h connecting the first surface 103f and the second surface 103g. The inclined surface 103h is inclined with respect to the first surface 103f and the second surface 103g.

Figure 23:
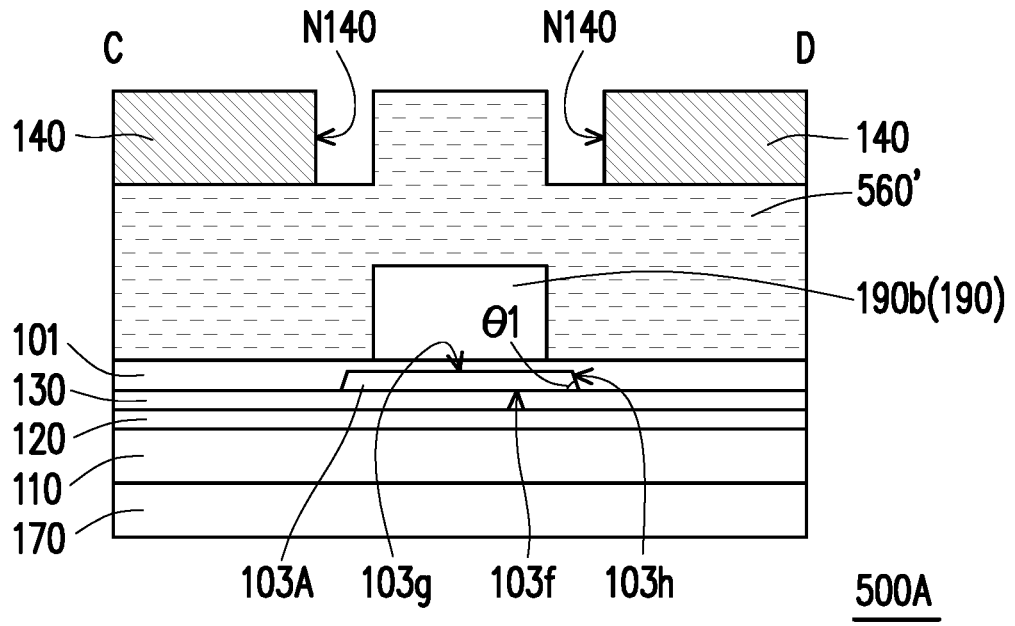
FIG. 23 is a schematic cross-sectional view of an LED according to an embodiment of the invention.
Figure 24:
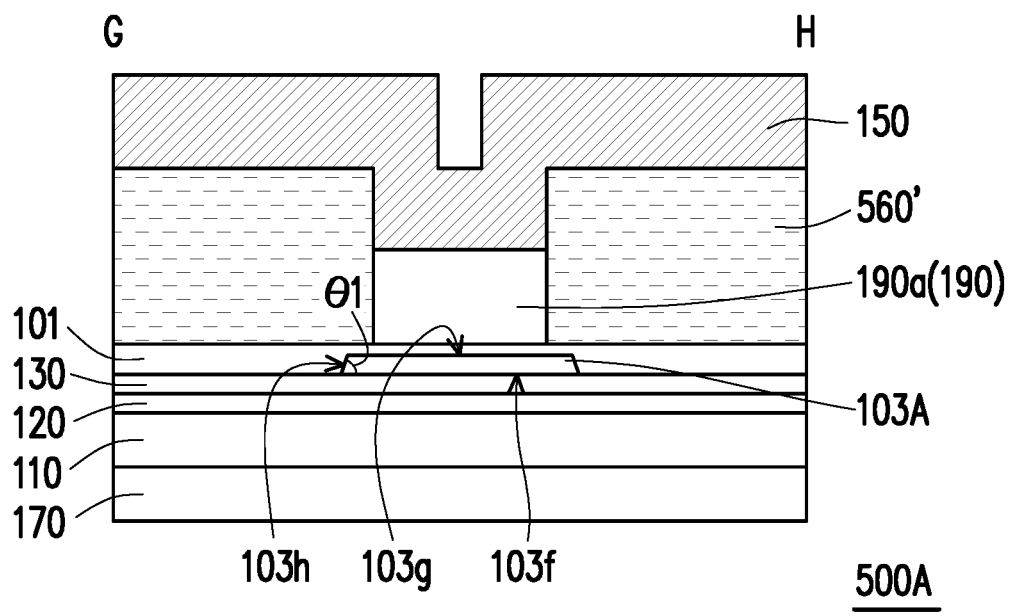
FIG. 24 is a schematic cross-sectional view of an LED according to an embodiment of the invention.

FIGS. 23 and 24 are schematic cross-sectional views of an LED according to an embodiment of the invention. A schematic top view of an LED 500A of FIGS. 23 and 24 is similar to the schematic top view of the LED 500 of FIG. 7. In particular, FIG. 23 corresponds to the cross-sectional line C-D of FIG. 7, and FIG. 24 corresponds to the cross-sectional line G-H of FIG. 7. The schematic top view of the LED 500A may be referred to FIG. 7, and details in this respect will thus not be repeated in the following. The LED 500A of FIGS. 23 and 24 is similar to the LED 500' of FIGS. 10 and 12. Therefore, like or corresponding components are referred to with like or corresponding symbols.

The LED 500A differs from the LED 500 in that the insulation patterns 103A of the LED 500A differ from the insulation patterns 103 of the LED 500. The following descriptions mainly focus on the difference. Like or corresponding parts may be referred to the previous descriptions based on the symbols in FIGS. 7, 23, and 24, and will not be repeated in the following.

Referring to FIGS. 7, 23, and 24, The LED 500A includes the first-type semiconductor layer 110, the emitting layer 120, the second-type semiconductor layer 130, the first electrode 140, the second electrode 150, and a Bragg reflector structure 560'. The emitting layer 120 is located between the first-type semiconductor layer 110 and the second-type semiconductor layer 130. The first electrode 140 is electrically connected to the first-type semiconductor layer 110. The second electrode 150 is electrically connected to the second-type semiconductor layer 130. The first electrode 140 and the second electrode 150 are located on the same side of a Bragg reflector structure 560'.

As illustrated in FIG. 7 and FIG. 23, at the recesses N140 of the first electrode 140, the first-type semiconductor layer 110, the emitting layer 120, the second-type semiconductor layer 130, the insulation patterns 103A, the conductive layer 101, the second metal layer 190, and the Bragg reflector structure 560' are sequentially stacked on the growth substrate 170. The profiles of the insulation patterns 103A correspond to the profile of the second metal layer 190 and the two are overlapped with each other. Specifically, the second metal layer 190 illustrated in FIG. 23 includes the finger portion 190b, and the finger portion 190b is correspondingly located within the recesses N140 of the first electrode 140 and thus is not overlapped with the first electrode 140. Moreover, the Bragg reflector structure 560' overlaps the finger portion 190b.

As illustrated in FIG. 7 and FIG. 24, in the area of the second electrode 150, the first-type semiconductor layer 110, the emitting layer 120, the second-type semiconductor layer 130, the insulation patterns 103A, the conductive layer 101, the second metal layer 190, and the Bragg reflector structure 560' are sequentially stacked on the growth substrate 170. The profiles of the insulation patterns 103A correspond to the profile of the second metal layer 190 and the two are overlapped with each other. Specifically, in FIG. 24, the welding portion 190a of the second metal layer 190 is overlapped with the second electrode 150 and the Bragg reflector structure 560' is disconnected in a region corresponding to the welding portion 190a, so as to allow the welding portion 190a of the second metal layer 190 to physically and electrically connect with the second electrode 150. In other words, the welding portion 190a of the second metal layer 190 is not overlapped with the Bragg reflector structure 560'.

As illustrated in FIGS. 7, 23, and 24, both the first metal layer 180 and the second metal layer 190 include a part overlapped with the Bragg reflector structure 560' and another part not overlapped with the Bragg reflector structure 560'. Part of the metal layer (i.e., part of the first metal layer 180 or part of the second metal layer 190) overlapped with the Bragg reflector structure 560' is not overlapped with the first electrode 140 and the second electrode 150. In this way, the thickness of the LED 500A may be more uniform, which helps improve the yield when bonding the LED 500 to other components.

What differs from the LED 500 is that the insulation pattern 130A has the first surface 103f facing toward the second-type semiconductor layer 130 and the second surface 103g facing away from the second-type semiconductor layer 130. In particular, the insulation pattern 103A further includes the inclined surface 103h connecting the first surface 103f and the second surface 103g. The inclined surface 103h is inclined with respect to the first surface 103f and the second surface 103g. The insulation patterns 103A are capable to blocking a current. The conductive layer 101 and the insulation patterns 103A may be disposed to disperse the current, so as to avoid the current from concentrating at certain part of the emitting layer 120, thereby allowing uniform distribution of the light emitting region of the emitting layer 120. In particular, the insulation pattern 103 may be configured based on FIG. 19A or FIG. 19B.

In view of the foregoing, in the light emitting diode according to an embodiment of the invention, the sidewall of the Bragg reflector structure is an inclined surface. Therefore, a layer (e.g., the second electrode) disposed on the Bragg reflector structure may properly cover the Bragg reflector structure, so as to facilitate the performance of the light emitting diode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode, comprising:
   a semiconductor structure comprising a first-type semiconductor layer, a second-type semiconductor layer and a light emitting layer disposed between the first-type semiconductor layer and the second-type semiconductor layer;
   an insulating structure disposed over the semiconductor structure, the insulation layer comprising a first insulating layer, a second insulating layer and a distributed Bragg reflector (DBR) layer sandwiched by the first insulating layer and the second insulating layer;
   a first patterned metal layer disposed between the insulating structure and the first-type semiconductor layer and electrically connected to the first-type semiconductor layer, wherein the first patterned metal layer comprises at least one first welding portion;
   a second patterned metal layer disposed between the insulating structure and the second-type semiconductor layer, wherein the second patterned metal layer comprises at least one second welding portion;
   a current dispersion layer formed over the second-type semiconductor layer and disposed between the second patterned metal layer and the semiconductor structure, wherein the second patterned metal layer is electrically connected to the first-type semiconductor layer through the current dispersion layer; and
   a first electrode layer and a second electrode layer apart disposed on the insulating structure,
   wherein the insulating structure has at least one first through hole exposing a portion of the welding portion of the first patterned metal layer and has at least one second through hole exposing a portion of the welding portion of the second patterned metal layer, wherein the first electrode layer and a second electrode layer are electrically connected to the first patterned metal layer and the second patterned metal layer through the first through hole and the second through hole, respectively,
   wherein the DBR layer of the insulating structure is not overlapped with the first welding portion of the first patterned metal layer and the second welding portion of the second patterned metal layer, respectively.

2. The light emitting diode as recited in claim 1, further comprising at least one insulation pattern disposed between the current dispersion layer and the second-type semiconductor layer and in contact with the second-type semiconductor layer, wherein the welding portion of the second patterned metal layer is aligned with the insulation pattern and is located within an area of a footprint of the insulation pattern.

3. The light emitting diode as recited in claim 2, wherein each of the insulation patterns comprises a plurality of first sub-layers and a plurality of second sub-layers, and the first sub-layers and the second sub-layers are stacked alternately and a material of each of the first sub-layers is different from a material of each of the second sub-layers.

4. The light emitting diode as recited in claim 2, wherein each of the insulation patterns comprises a plurality of first sub-layers and a plurality of second sub-layers, and the first sub-layers and the second sub-layers are stacked alternately and a material of each of the first sub-layers is the same to a material of each of the second sub-layers, and a density of each of the first sub-layers is different from a density of each of the second sub-layers.

5. The light emitting diode as recited in claim 1, wherein a reflectance of the DBR layer is greater than or equal to 90% in a reflective wavelength range at least covering 0.8(X) nm to 1.8(X) nm, the light emitting layer is configured to emit a beam, the beam has a peak wavelength within an emission wavelength range, and X is the peak wavelength of the emission wavelength range.

6. The light emitting diode as recited in claim 1, wherein the distributed Bragg reflector (DBR) layer of the insulation structure is entirely enclosed by the first insulating layer and the second insulating layer.

7. The light emitting diode as recited in claim 1, wherein the first electrode layer is not overlapped with the second welding portion of the second patterned metal layer.

8. The light emitting diode as recited in claim 1, wherein the second electrode layer is not overlapped with the first welding portion of the first patterned metal layer.

9. A light emitting diode, comprising:
a semiconductor structure comprising a first-type semiconductor layer, a second-type semiconductor layer and a light emitting layer disposed between the first-type semiconductor layer and the second-type semiconductor layer;
an insulating structure disposed over the semiconductor structure, the insulation layer comprising a first insulating layer and a distributed Bragg reflector (DBR) layer attached to the first insulating layer;
a first patterned metal layer disposed between the insulating structure and the first-type semiconductor layer and electrically connected to the first-type semiconductor layer, wherein the first patterned metal layer comprises at least one first welding portion;
a second patterned metal layer disposed between the insulating structure and the second-type semiconductor layer, wherein the second patterned metal layer comprises at least one second welding portion;
a current dispersion layer formed over the second-type semiconductor layer and disposed between the second patterned metal layer and the semiconductor structure, wherein the second patterned metal layer is electrically connected to the first-type semiconductor layer through the current dispersion layer; and
a first electrode layer and a second electrode layer apart disposed on the insulating structure,
wherein the insulating structure has at least one first through hole exposing a portion of the welding portion of the first patterned metal layer and has at least one second through hole exposing a portion of the welding portion of the second patterned metal layer, wherein the first electrode layer and a second electrode layer are electrically connected to the first patterned metal layer and the second patterned metal layer through the first through hole and the second through hole, respectively,
wherein the DBR layer of the insulating structure is not overlapped with the first welding portion of the first patterned metal layer and the second welding portion of the second patterned metal layer, respectively.

10. The light emitting diode as recited in claim 9, further comprising at least one insulation pattern disposed between the current dispersion layer and the second-type semiconductor layer and in contact with the second-type semiconductor layer, wherein the welding portion of the second patterned metal layer is aligned with the insulation pattern and is located within an area of a footprint of the insulation pattern.

11. The light emitting diode as recited in claim 10, wherein each of the insulation patterns comprises a plurality of first sub-layers and a plurality of second sub-layers, and the first sub-layers and the second sub-layers are stacked alternately and a material of each of the first sub-layers is the same to a material of each of the second sub-layers, and a density of each of the first sub-layers is different from a density of each of the second sub-layers.

12. The light emitting diode as recited in claim 9, wherein a reflectance of the DBR layer is greater than or equal to 90% in a reflective wavelength range at least covering 0.8(X) nm to 1.8(X) nm, the light emitting layer is configured to emit a beam, the beam has a peak wavelength within an emission wavelength range, and X is the peak wavelength of the emission wavelength range.

13. The light emitting diode as recited in claim 9, wherein the first electrode layer is not overlapped with the second welding portion of the second patterned metal layer.

14. The light emitting diode as recited in claim 9, wherein the second electrode layer is not overlapped with the first welding portion of the first patterned metal layer.

15. A light emitting diode, comprising:
a semiconductor structure comprising a first-type semiconductor layer, a second-type semiconductor layer and a light emitting layer disposed between the first-type semiconductor layer and the second-type semiconductor layer, wherein the semiconductor structure has at least one groove to expose the first-type semiconductor layer;
an insulating structure disposed over the semiconductor structure;
a current dispersion layer disposed between the semiconductor structure and the insulating structure and formed over the second-type semiconductor layer; and
a first electrode layer and a second electrode layer apart disposed on the insulating structure, wherein the first electrode layer is electrically connected to the first-type semiconductor layer by penetrating through the groove, and the second electrode layer is electrically connected to the second-type semiconductor through the current dispersion layer,
wherein the first electrode layer and the second electrode layer are not overlapped with the at least one groove, respectively.

16. The light emitting diode as recited in claim 15, wherein, the first insulation structure comprising a distributed Bragg reflector (DBR) layer.

17. The light emitting diode as recited in claim 16, wherein the a first insulating layer further comprises a first insulating layer, a second insulating layer, the distributed Bragg reflector (DBR) layer is entirely enclosed by the first insulating layer and the second insulating layer.

18. The light emitting diode as recited in claim 15, wherein a reflectance of the DBR layer is greater than or equal to 90% in a reflective wavelength range at least covering 0.8(X) nm to 1.8(X) nm, the light emitting layer is configured to emit a beam, the beam has a peak wavelength within an emission wavelength range, and X is the peak wavelength of the emission wavelength range.

19. The light emitting diode as recited in claim 15, wherein a material of the eutectic layer comprises gold (Au), gold/tin (Au/Sn) alloy, or other conductive materials applicable in eutectic bonding.

* * * * *